United States Patent
McCallister et al.

(10) Patent No.: US 8,649,743 B2
(45) Date of Patent: Feb. 11, 2014

(54) TRANSMITTER LINEARIZED USING INVERSING AND NON-INVERSING TRANSFORM PROCESSING SECTIONS AND METHOD THEREFOR

(75) Inventors: Ronald Duane McCallister, Scottsdale, AZ (US); Eric M. Brombaugh, Mesa, AZ (US)

(73) Assignee: CrestCom, Inc., Scottsdale, AZ (US)

( * ) Notice: Subject to any disclaimer, the term of this patent is extended or adjusted under 35 U.S.C. 154(b) by 770 days.

(21) Appl. No.: 12/860,436

(22) Filed: Aug. 20, 2010

(65) Prior Publication Data

US 2012/0034886 A1    Feb. 9, 2012

Related U.S. Application Data

(60) Provisional application No. 61/370,180, filed on Aug. 3, 2010.

(51) Int. Cl.
    *H04B 1/04*      (2006.01)
(52) U.S. Cl.
    USPC ............ 455/114.2; 455/114.3; 455/126; 455/67.13; 455/103; 455/127.1; 375/296; 375/297; 375/269; 375/285; 330/149; 330/136
(58) Field of Classification Search
    USPC ........... 455/114.2, 114.3, 126, 67.13, 63.1, 455/127.1; 375/296, 297, 269, 285; 330/149, 136
    See application file for complete search history.

(56) References Cited

U.S. PATENT DOCUMENTS

| | | | |
|---|---|---|---|
| 7,113,037 B2 * | 9/2006 | Nezami | 330/149 |
| 7,170,343 B2 | 1/2007 | Jin et al. | |
| 7,466,197 B2 | 12/2008 | Benedict et al. | |
| 7,469,491 B2 | 12/2008 | McCallister et al. | |
| 7,479,828 B2 | 1/2009 | Benedict | |
| 7,551,905 B2 | 6/2009 | Kubo et al. | |
| 2009/0124218 A1 | 5/2009 | McCallister et al. | |
| 2009/0227215 A1 | 9/2009 | McCallister | |
| 2009/0323856 A1 | 12/2009 | McCallister | |

FOREIGN PATENT DOCUMENTS

KR      2001-0083262 A      9/2001

OTHER PUBLICATIONS

Cavers, "A Linearizing Predistorter With Fast Adaptation", (40th IEEE Vehicular Technology Conference), May 1990, pp. 41-47, Canada.
Chalermwisutkul, "Phenomena of Electrical Memory Effects on the Device Level and Their Relations", (Proceedings of ECTI-CON 2008), May 2008, pp. 229-232, Thailand.

(Continued)

*Primary Examiner* — Junpeng Chen
(74) *Attorney, Agent, or Firm* — Schmeiser, Olsen & Watts LLP; Lowell W. Gresham

(57) ABSTRACT

A transmitter (50) includes a nonlinear predistorter (58) having two instances of an inverting transform (106, 106') that may be implemented in a look-up table (122) and that implements a transform which is the inverse of an average terms component (96) of a nonlinear transform model (94) for an amplifier (70). The look-up table (122) may be updated using a continuous process control loop that avoids Cartesian to polar coordinate conversions. One of the two instances of the inverting transform (106) is cascaded with a non-inversing transform (108) within a residual cancellation section (110) of the predistorter (58). The non-inversing transform (108) implements a transform which is an estimate of a deviation terms component (98) of the nonlinear transform model (94). The residual cancellation section (110) produces a weak signal that replaces an unwanted residual term in an amplified communication signal (76) with a much weaker residual term.

30 Claims, 9 Drawing Sheets

(56) References Cited

OTHER PUBLICATIONS

D'Andrea et al., "Parallel Amplitude and Phase Predistortion for RF Power Amplifier Linearization", (IEEE Globecom'95), Nov. 1995, pp. 198-202, Italy.
Ding et al., "A Memory Polynomial Predistorter Implemented Using TMS320C67XX", (Proceedings of Texas Instruments Developer Conference), Feb. 2004, pp. 1-7, Texas, USA.
Faulkner et al., "Adaptive Linearisation Using Predistortion", (40th IEEE Vehicular Technology Conference), May 1990, pp. 35-40, Australia.
Ghaderi et al., "Fast Adaptive Predistortion Lineariser Using Polynomial Functions", (Electronics Letters), Aug. 19, 1993, pp. 1526-1528, vol. 29, No. 19, Canada.
Hammi et al., "On the Effects of the Average Power of Training Sequences Used to Synthesize Memory Digital Predistorters in WCDMA Transmitters", (© 2007 EuMA Proceedings of the 37th European Microwave Conference), Oct. 2007, pp. 174-177, Munich, Germany.
Hammi et al., "On the Sensitivity of RF Transmitters' Memory Polynomial Model Identification to Delay Alignment Resolution", (IEEE Microwave and Wireless Components Letters), Apr. 2008, pp. 263-265, vol. 18, No. 4, Canada.
He et al., "Performance of Adaptive Predistortion With Temperature in RF Power Amplifier Linearization", (Fifth International Symposium on Signal Processing and its Applications), Aug. 1999, pp. 717-720, Brisbane, Australia.
Jebali et al., "Performance Assessment of RF Power Amplifier Memory Polynomial Models Under Different Signal Statistics", (© 2009 IEEE), pp. 383-386, Canada.
Liu et al., "Deembedding Static Nonlinearities and Accurately Identifying and Modeling Memory Effects in Wide-Band RF Transmitters", (IEEE Transactions on Microwave Theory and Techniques), Nov. 2005, pp. 3578-3587, vol. 53, No. 11, Canada.
Liu et al., "Linearization of Wideband RF Doherty Power Amplifiers with Complex Dynamic Nonlinearities", (Communications and Networking in ChinaCom 2008), Aug. 2008, pp. 974-977, China.
Morgan et al., "A Generalized Memory Polynomial Model for Digital Predistortion of RF Power Amplifiers", (IEEE Transactions on Signal Processing), Oct. 2006, pp. 3852-3860, vol. 54, No. 10, Canada.
Paasschens et al., "Dependence of Thermal Resistance on Ambient and Actual Temperature", (Proceedings of the 2004 Meeting on Bipolar Bicmos Circuits & Technology), Sep. 2004, pp. 96-99, The Netherlands.
Rey et al., "RF Power Amplifier Modeling Using Polynomials With IIR Bases Functions", (IEEE Microwave and Wireless Components Letters, (© 2009 IEEE), pp. 43-46, Canada.
Schurack et al., "Analysis and Measurement of Nonlinear Effects in Power Amplifiers Caused by Thermal Power Feedback", (IEEE International Symposium on Circuits and Systems), May 1992, pp. 758-761, Munich, Germany.
Tornblad et al., "Modeling and Measurements of Electrical and Thermal Memory Effects for RF Power LDMOS", (IEEE/MTT-S International Microwave Symposium), Jun. 2007, pp. 2015-2018, USA.
Wright et al., "Experimental Performance of an Adaptive Digital Linearized Power Amplifier", (IEEE Transactions on Vehicular Technology), Nov. 1992, pp. 395-400, vol. 41, No. 4, Canada.
Yong-Sheng et al., "Research of Electro-Thermal Memory Effect of RF Power Amplifier based on LDMOS EFT", (4th Asia-Pacific Conference on Environmental Electromagnetics), Aug. 2006, CEEM'2006/Dalian 4A2-09, pp. 787-791, China.
Younes et al., "An Accurate Complexity-Reduced "Plume" Model for Behavioral Modeling and Digital Predistortion of RF Power Amplifiers", (© 2010 IEEE), pp. 1-9, Canada.
Zhu et al., "An Overview of Volterra Series Based Behavioral Modeling of RF/Microwave Power Amplifiers", (RF & Microwave Research Group University College Dublin © 2006 IEEE), pp. 1-5, Ireland.

\* cited by examiner

TRANSMITTER LINEARIZED USING INVERSING AND NON-INVERSING TRANSFORM PROCESSING SECTIONS AND METHOD THEREFOR

RELATED INVENTIONS

The present invention claims priority under 35 U.S.C. §119 (e) to: "Transmitter Linearized Using Inversing and Non-Inversing Transform Processing Sections and Method Therefor," U.S. Provisional Patent Application Ser. No. 61/370,180, filed 3 Aug. 2010, which is incorporated in its entirety by reference herein.

TECHNICAL FIELD OF THE INVENTION

The present invention relates generally to the field of communication systems. Specifically, the present invention relates to predistorters which reduce distortion introduced into a communication signal by an imperfectly linear amplifier.

BACKGROUND OF THE INVENTION

Many popular modulation formats used in the field of digital communications assume the availability of a linear amplifier in a transmitter to boost a communication signal to a level at which it may be successfully broadcast from an antenna, then propagate to and be demodulated by a remotely located receiver. Linearity refers to the ability of an amplifier to faithfully reproduce a signal presented to it without causing the output signal from the amplifier to be distorted in some way. To the extent that the amplifier is imperfectly linear, distortion and spectral regrowth result. If this distortion and spectral regrowth are excessive, then the transmitter may fail to successfully operate within a spectral mask imposed by regulations and/or within power specifications.

Unfortunately, real-world amplifiers tend to exhibit nonlinear performance to some degree, and the degree to which they are nonlinear tends to be proportional to the amplifiers' cost and power inefficiency. In other words, the more desirable amplifier components and architectures from a cost and power efficiency perspective tend to exhibit greater nonlinearity tendencies. Thus, modern transmitter designs have benefitted from linearization efforts, in which the transmitter includes signal processing steps and circuits that compensate for amplifier nonlinearity.

One form of linearization is called predistortion because the processing steps and circuits are primarily included upstream of the amplifier. A predistorter intentionally distorts a more-or-less ideally configured communication signal, and the intentional distortion is specifically configured to counteract the distortion that the downstream amplifier will introduce. When the predistorter is implemented using digital circuits, costs may be held low and the signal processing of the predistorter may be somewhat insulated from noise, when compared to linearization efforts that rely extensively on analog signal processing.

FIG. 1 shows a simplified block diagram of a conventional approach to implementing predistortion in an RF transmitter 20. A nonlinear predistorter 22 resides upstream of an RF amplifier 24. A communication signal 26, preferably in digital form, is presented to nonlinear predistorter 22 where it is distorted and transformed into a predistorted communication signal 28. Predistorted communication signal 28 receives further processing, such as being converted into an analog signal and upconverted to RF, and is then presented to amplifier 24. Amplifier 24 transforms signal 28 into an output RF communication signal 30, which represents an amplified but distorted version of predistorted communication signal 28. Desirably, amplifier 24 distorts predistorted communication signal 28 in a way that causes output RF communication signal 30 to closely resemble communication signal 26, not considering the processing that takes place between predistorter 22 and amplifier 24.

The conventional approach depicted in FIG. 1 uses communication signal 26 and feedback obtained from output RF communication signal 30 to model the actual behavior of amplifier 24 at a control block 32. Many forms of Volterra models have been used in characterizing the actual behavior of amplifier 24, with a currently popular form of this approach being called a generalized memory polynomial (GMP) model. The basic approach assumes that the amplifier 24 may be characterized by a complicated system of polynomial equations that includes numerous unknown memory-less terms 34, unknown memory polynomial terms 36, and perhaps unknown envelope memory polynomial terms 38, which all can add together to adequately characterize the actual performance of amplifier 24 when the unknown terms are discovered.

Unfortunately, these numerous unknown terms are not independent of one another but exhibit an extensive amount of cross correlation. And, memory polynomial terms are difficult to model because amplifier 24 tends to exhibit both long-term and short-term memory behaviors. Consequently, control block 32 is constrained to operate on extremely large blocks of samples from signals 26 and 30 and to calculate an extremely large number of terms in order to adequately characterize the behavior of amplifier 24. Then, when the behavior has been characterized, a matrix inversing operation is performed to determine the inverse of the system of equations that characterizes the behavior of amplifier 24. The inverse may be viewed as another system of complicated equations, and terms from the inverse system of equations are used in updating an inverse memory-less terms block 40 and an inverse memory terms block 42 within nonlinear predistorter 22. Block 40 is conventionally implemented using a look-up table (LUT), and block 42 is conventionally implemented using a complicated two-dimensional finite impulse response (FIR) filter structure.

This conventional approach, which operates on extremely large blocks of samples, resolves extremely complicated equations, and then performs an inversing operation of the complicated equations, is called a polynomial batch approach herein. Unfortunately, the polynomial batch approach is effective in only limited applications and is completely unsuitable for other applications. The effectiveness of the polynomial batch approach is limited due to the massive amount of computational resources needed to implement control block 22. In order to maintain this massive amount of computational resources at practical levels even for limited applications, the time needed to calculate updates for nonlinear predistorter 22 is undesirably long, often several seconds, leading to an extremely slow loop bandwidth and an inability of transmitter 20 to respond adequately to signal dynamics. And, the power requirements of the polynomial batch approach are so great that this approach is unsuitable for battery-powered devices, which cannot tolerate excessive power consumption that reduces battery charge time and/or forces the use of larger batteries. Moreover, even in the limited applications where the polynomial batch approach is effective, it achieves poorer performance than desired due at least in part to a dependence on signal statistics, temperature, power level, and other normal dynamic signal characteristics for a given block of samples being processed.

An alternate conventional technique from the polynomial batch approach is a form of a continuous process control loop. Whereas a batch process collects data over a period of time, then presents an entire block of data to a subsequent process for further processing as a unit, a continuous process operates on each element of data as it becomes available. Nothing requires a continuous process control loop to operate at a 100% duty cycle, but while the process is active the continuous process operates on each data element as it becomes available, and if the continuous process goes inactive for a period data are generally ignored or used for another purpose. The continuous process control loop approach is able to update a predistorter using far fewer computational resources than are demanded by the polynomial batch approach.

A conventional continuous process control loop approach attempts to identify separate physical factors that lead to nonlinearities in the output RF communication signal, and to implement separate circuits and processing steps to be taken in a predistorter that is made up of separate components corresponding to the separate nonlinearity factors. The separate nonlinearity factors may include a static or memoryless nonlinearity, one or more thermal memory nonlinearities, one or more electronic-based memory nonlinearities, and the like. Then, separate feedback control loops are implemented to cause the separate components to converge on a solution for each component that, when combined with the solutions for the other components, achieves satisfactory linearization. But due to the extensive number of nonlinearity factors and the cross correlation that exists between nonlinearity factors, it has proven difficult to adequately de-embed individual nonlinearity factors so that other nonlinearity factors can be identified. Consequently, it has been difficult to produce a combined solution that yields entirely satisfactory results.

Accordingly, a need exists for a continuous process control loop approach that achieves, and preferably improves upon, the results of the polynomial batch approach using far fewer computational resources than are demanded by the polynomial batch approach.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

Figure 1:
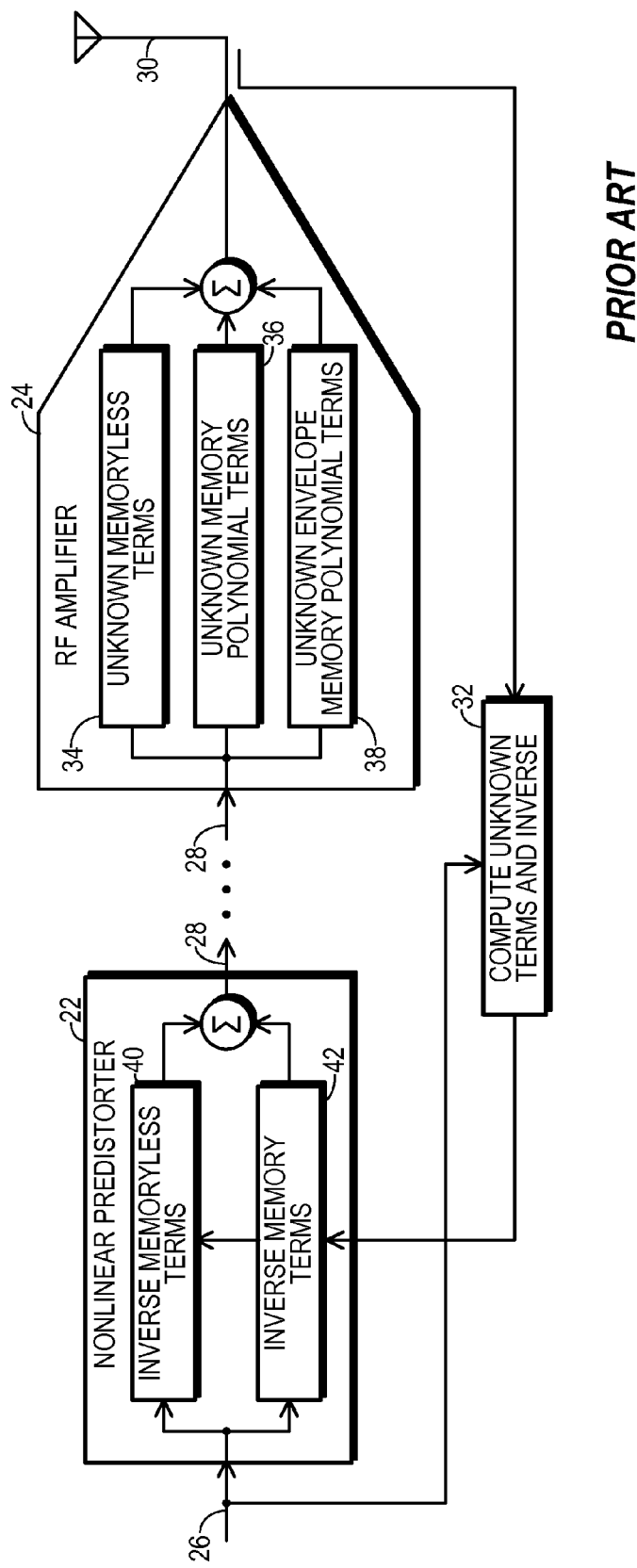
FIG. 1 shows a simplified block diagram of a prior art transmitter having an amplifier and a nonlinear predistorter.
Figure 2:
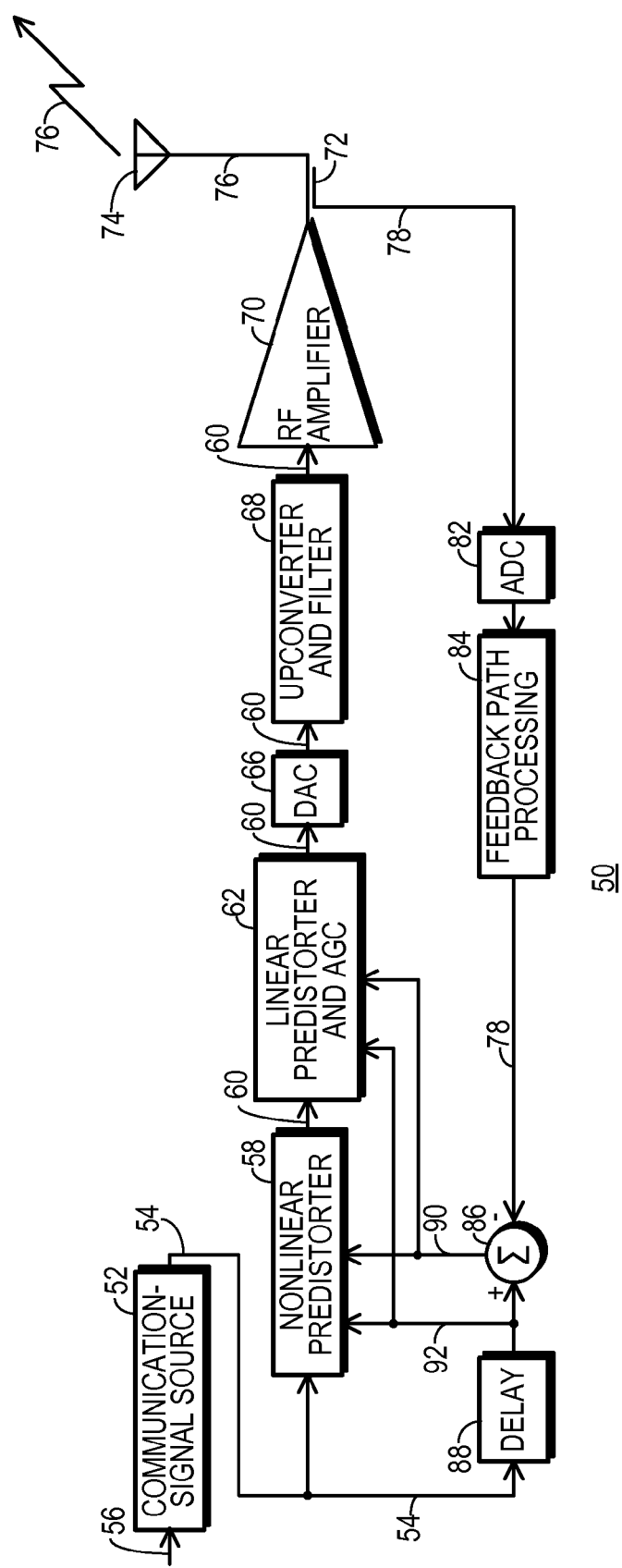
FIG. 2 shows a simplified block diagram of a transmitter configured in accordance with one embodiment of the present invention.

FIG. 2 shows a simplified block diagram of a transmitter 50 configured in accordance with the teaching of one embodiment of the present invention. In the embodiment explicitly depicted in the figures, transmitter 50 is configured to wirelessly transmit an RF communication signal. But those skilled in the art will appreciate that the present invention may also be used in other types of communication systems, including a communication system that transmits optical signals through an optical transmission medium.

Transmitter 50 includes a communication-signal source 52. Communication-signal source 52 provides a digitally modulated, complex, baseband version of a communication signal 54. A communication signal, such as communication signal 54 and others discussed below, is an electronic signal that may undergo a variety of different processing steps and be represented in a variety of different ways, including as one or more digital streams of data or as one or more analog signals. A communication signal has been modulated with information and/or data. The transmission of this information and/or data is the primary purpose of transmitter 50, and a communication signal could be demodulated or otherwise processed to recover the information and/or data.

Communication-signal source 52 may perform any number of activities well known to those skilled in the art of digital transmitters. For example, raw data to be transmitted from transmitter 50 may be digitally modulated using a suitable form of digital modulation, such as QPSK, CDMA, OFDM, or the like. Multiple data streams 56 may have been digitally modulated and combined together for transmission, as is common in a cellular base station, or a single data stream 56 may have been digitally modulated for transmission, as is common in an end-user's wireless device, such as a cell phone, laptop, netbook, electronic book, wireless network adapter, wireless router, and the like. The digitally modulated signal may have been pulse shaped to limit bandwidth while minimizing intersymbol interference (ISI). Additional processing may have been performed to reduce the peak-to-average power ratio. Any or all of these and other types of signal processing activities may be performed at communication-signal source 52.

As a result of the processing performed at communication-signal source 52, communication signal 54 is a baseband, digitally modulated, complex signal that exhibits a bandwidth roughly equal to the bandwidth allocated to transmitter 50 for the transmission of RF energy. This bandwidth resides at baseband (i.e., near DC). Desirably, communication signal 54 is an analytic signal having a bandwidth centered at or near 0 Hz and represented using the Cartesian (i.e., rectilinear) coordinate system, in which each sample includes real and imaginary, or in-phase and quadrature, components.

Communication signal 54 drives a nonlinear predistorter 58. Nonlinear predistorter 58 spectrally processes communication signal 54 to introduce wide bandwidth distortion into the communication signal. This distortion extends over a bandwidth that exceeds the bandwidth of communication signal 54. Although not shown in FIG. 2, the sampling rate of communication signal 54 may be increased to accommodate the increased bandwidth. Nonlinear predistorter 58 converts the communication signal into a predistorted communication signal 60. Nonlinear predistorter 58 is discussed in more detail below in connection with FIGS. 3-9. Predistorted communication signal 60 drives a linear predistorter and AGC section 62. In one embodiment, section 62 is implemented as an adaptive FIR filter, where adaptation of the center tap provides the automatic gain control function. In addition, at section 62 the communication signal is spectrally processed to introduce in-band predistortion (i.e., distortion confined within the bandwidth of communication signal 54). Predistorted communication signal 60 is presented at the output of linear predistorter 62 in a form that includes both linear and nonlinear predistortion.

Predistorted communication signal 60 propagates from linear predistorter and AGC section 62 toward a digital-to-analog converter (DAC) 66. DAC 66 converts predistorted communication signal 60 into an analog signal that drives an upconverter and filter section 68. Section 68 frequency shifts predistorted communication signal 60, now in analog form, to the allocated frequency band for transmitter 50 and filters the frequency-shifted signal to pass only a desired sideband. Section 68 produces an RF form of the communication signal. Predistorted communication signal 60, now in RF form, is then fed to an input of an amplifier 70. In one embodiment, amplifier 70 is a radio-frequency (RF) amplifier, or high-power amplifier (HPA), known to those of skill in the art of wireless communications.

In the embodiment depicted in FIG. 2, an output of amplifier 70 couples through a directional coupler 72 to an antenna 74. Amplifier 70 amplifies the RF form of communication signal 60 to produce an amplified RF signal 76, which is broadcast from transmitter 50 at antenna 74. Desirably, the nonlinear and linear predistortion respectively introduced upstream through the operations of nonlinear predistorter 58 and linear predistorter 62 are of the correct character and composition to cancel distortions introduced downstream of DAC 66, and amplified RF signal 76 closely corresponds to a linear amplification of communication signal 54 provided by communication-signal source 52, but in analog form and shifted in frequency to the allocated frequency band for transmitter 50.

In order for the upstream predistortions to be of the correct character and composition to cancel distortions introduced downstream of DAC 66 it is desirable that amplified RF signal 76 be monitored and that the upstream predistortions be responsive to amplified RF signal 76. Accordingly, a tap-off port of directional coupler 72 extracts a small portion of amplified RF signal 76 for use as a feedback signal 78. Feedback signal 78 is routed through an analog-to-digital converter (ADC) 82, where it is then presented to a feedback path processing section 84. ADC 82 desirably operates at high speed and is phase coherent with the upconversion of section 68 so as to perform downconversion by digital subharmonic sampling. This form of downconversion is desirable because it lessens the corruption of feedback signal 78 than might occur if downconversion is performed through a more analog-intensive form of downconversion. But other forms of downconversion may also be used provided they introduce sufficiently low distortion into feedback signal 78.

Processing section 84 performs digital processing on feedback signal 78. In particular, processing section 84 desirably includes a Hilbert transformation to place feedback signal 78 in a complex, analytic signal form represented using the Cartesian coordinate system, as well as scaling to compensate for linear gain in the forward and feedback signal paths. And, processing section 84 may include a phase rotation to compensate for phase rotation introduced downstream of DAC 66, primarily in a band-pass filter portion of section 68. Eventually, feedback signal 78, now in digital complex Cartesian form, is supplied to a negative input of a subtraction circuit 86.

Communication signal 54 from communication-signal source 52 is also fed through a delay element 88 to a positive input of subtraction circuit 86. Although not shown, the sample rate of communication signal 54 may be increased prior to application at subtraction circuit 86 to accommodate the full bandwidth of feedback signal 78, which is wider than the bandwidth of communication signal 54. Delay element 88 is configured to temporally align communication signal 54 with feedback signal 78 at subtraction circuit 86. In other words, delay element 88 is configured so that a sample of communication signal 54 processed through a first path which includes delay element 88 and a second path that includes amplifier 70 and feedback path processing section 84 arrive at subtraction circuit 86 at the same time.

An output of subtraction circuit 86 generates an error signal 90 which describes the manner in which amplified RF signal 76 fails to be a linear amplification of communication signal 54. Error signal 90 and communication signal 54 configured in a delayed form 92 are each presented to control inputs of nonlinear predistorter 58 and of linear predistorter and AGC section 62.

In one embodiment, linear predistorter and AGC section 62 is implemented using an adaptive equalizer that adjusts equalizer coefficients in response to a least-means square (LMS) based continuous processing control loop algorithm. The adaptive equalizer of linear predistorter 62 desirably estimates a coefficient value for the center tap that will apply gain or attenuation as needed to maintain the amplitudes of feedback signal 78 and delayed communication signal 92 at approximately equal levels.

In addition, the adaptive equalizer of linear predistorter 62 desirably estimates coefficient values for the other taps to influence the amount of linear distortion in amplified RF signal 76, then alters these coefficients over time to adjust the predistortion transformation function (transform) applied by the adaptive equalizer and to achieve decreasing amounts of linear distortion until convergence is reached at a minimum amount of linear distortion. The continuous processing control loop trains linear predistorter and AGC section 62 to adjust gain and reduce linear distortion in response to correlation between the conjugated form of error signal 90 and delayed communication signal 92. Through error signal 90, linear predistorter 62 is driven by and responsive to amplified RF signal 76. Those skilled in the art may devise other forms of linear predistorters for use in transmitter 50.

Figure 3:
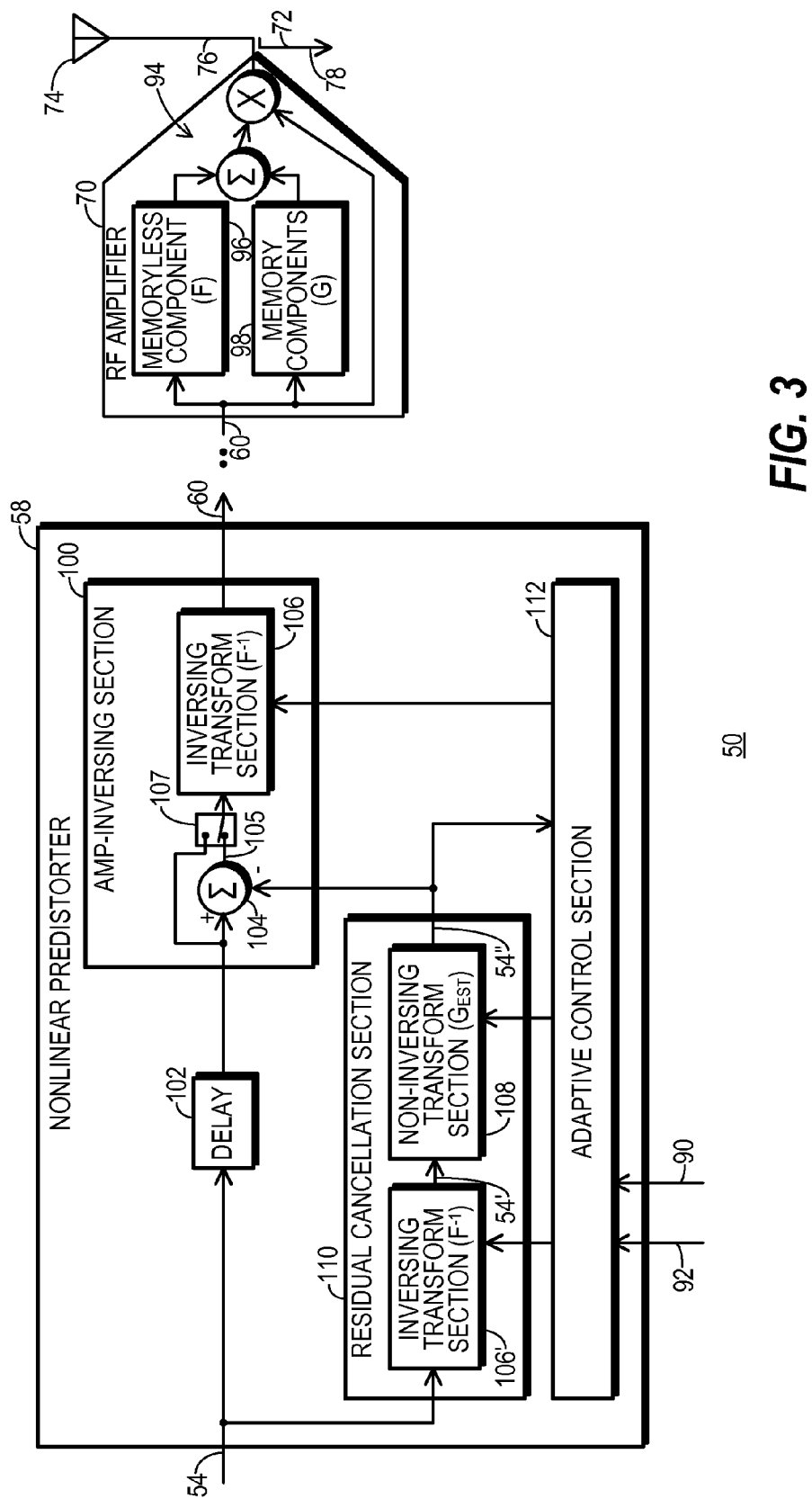
FIG. 3 shows a simplified block diagram of the transmitter of FIG. 2, with details shown concerning a first embodiment of a nonlinear predistorter portion of the transmitter.

FIG. 3 shows a simplified block diagram of transmitter 50 as discussed above and as shown in FIG. 2, but with details shown concerning a first embodiment of nonlinear predistorter 58, with a behavioral model 94 for amplifier 70, and with other details omitted.

The block diagram of model 94 presented in FIG. 3 provides an explanation for the way in which linear and nonlinear influences from amplifier 70 appear to behave. Those skilled in the art will appreciate that amplifier 70 is constructed from real components and materials that fail to operate precisely as desired. Accordingly, models, such as model 94, may be devised to explain the manner in which amplifier 70 appears to actually operate. The specific components of model 94 need not be observable in a real world version of amplifier 70.

Model 94 depicts amplifier 70 as having its transfer function, referred to below as a nonlinear amplifier transform, partitioned into two distinct types of nonlinear components.

The two types include a memoryless component 96 and memory components 98. Although not shown, memory components 98 may include any number of individual memory components coupled in parallel, with each memory component corresponding to a specific memory nonlinearity of amplifier 70. The form of communication signal 60 input to amplifier 70 drives both of components 96 and 98. The sum of signals output from components 96 and 98 represents the nonlinear gain factor by which amplifier 70 multiplies or amplifies communication signal 60.

Those skilled in the art will appreciate that model 94 is configured primarily to characterize the influence of nonlinearities. A more complete model may reflect other considerations. The more complete model is not presented here because it is unnecessary to an understanding of the nonlinearities to which the below-discussed features of the preferred embodiments of the present invention are directed.

The two-component partitioning of model 94 reflects two types of characteristics of transmitter 50 that may be de-embedded from each other in continuous process control loops. Memoryless component 96 may also be called a static component. Component 96 represents a mathematical relationship or equation that explains the average behavior of amplified RF signal 76 in terms of predistorted communication signal 60 input to amplifier 70. This equation and its terms are unknown and need not be explicitly identified. Rather, it is effectively measured in a continuous process control loop (discussed below) that repeatedly makes changes in the character of input signal 60, observes the results of those changes in amplified RF signal 76, then repeats the process to converge on a solution that implicitly identifies the equation.

This average behavior is viewed over a tracking period corresponding to the loop bandwidth of the continuous process control loop. The tracking period may be implemented within a wide range of potential periods. For example, in one embodiment the tracking period may be set anywhere within a range of 0.0002 sec. to 2 sec.

A precise mathematical average or mean is not required in identifying the average behavior. Rather the average refers to, for each possible single value of input signal 60, a single value for amplified RF signal 76 that summarizes or represents the general significance of the set of all values that amplified RF signal 76 takes over the tracking period at that value of input signal 60. In contrast to the polynomial approach, memoryless component 96 may be viewed as representing the influences of memoryless terms in addition to the average of all memory terms over the tracking period. Memoryless component 96 may also be viewed as characterizing the basic gain of amplifier 70. FIG. 3 denotes that memoryless component 96 is characterized by a nonlinear transform having a function name of "F".

Memory components 98 of model 94 represent a mathematical relationship or equation, or a set of such relationships or equations, that explain the deviations observed in the behavior of amplified RF signal 76 from the average behavior characterized by average terms 96. In other words, each instant of communication signal 60 produces an influence in the amplified RF signal 76 that occurs instantly and is also distributed over time. Desirably, for any given instant of communication signal 60, this influence extinguishes in far less time than the tracking period for memoryless component 96. Memory components 98 explain this distributed influence. These equations and their terms are unknown and need not be explicitly identified. Rather, they are effectively measured in one or more continuous process control loops (discussed below) that repeatedly make changes in the character of input signal 60, observe the results of those changes in amplified RF signal 76, then repeat the process to converge on a solution that implicitly identifies each equation of interest. FIG. 3 denotes that memory component 98 is characterized by a nonlinear transform having a function name of "G".

The tracking period discussed above in connection with memoryless component 96 may be viewed as a slow tracking period. In contrast, memory components 98 are implicitly measured throughout a duration less than the slow tracking period used for memoryless component 96. All control loops associated with memory components 98 may be viewed as having a fast tracking period in comparison to the slow tracking period for memoryless component 96. The length of the fast tracking period corresponds to the nonlinearity being implicitly measured. For example, one nonlinearity may be a thermal time constant associated with the die and/or packaging of the semiconductor component used to implement amplifier 70. Such a thermal time constant may be in a range of from tens of microseconds to hundreds of microseconds. A fast tracking period compatible with this time constant is implemented in a continuous process control loop, and such a fast tracking period is desirably faster than the slow tracking period of memoryless component 96.

The difference in temporal characteristics between components 96 and 98 in model 94 is one factor that allows memory component 96 to be de-embedded from memory components 98 and vice-versa. Another difference that allows memoryless component 96 to be de-embedded from memory components 98 and vice-versa is that model 94 partitions the nonlinear transform of amplifier 70 so that memoryless component 96 applies more gain than memory components 98. In fact, preferably the vast majority of the power of amplified RF signal 76 passes through memory component 96. In one embodiment, memory component 96 exhibits a basic gain more than 16 dB greater than the gain associated with memory components 98.

Referring to nonlinear predistorter 58, communication signal 54 drives an amp-inversing processing section 100 through a delay element 102. Amp-inversing processing section 100 includes a combiner 104, preferably in the form of a subtraction circuit. Communication signal 54 is fed to a positive input of combiner 104 after being delayed in delay element 102. An output of combiner 104 provides a combined communication signal 105 that feeds one input port of a mode switch 107 while the delayed form of communication signal 54 directly feeds another input port of mode switch 107. An output port of mode switch 107 drives an inversing transform processing section 106. Mode switch 107 is controlled to provide either communication signal 54 at its output port during an inversing transform update mode or combined communication signal 105 at its output port during a normal mode. These modes of operation are discussed in more detail below in connection with FIGS. 5-9. The output of inversing transform processing section 106 provides the output for amp-inversing processing section 100, the output for nonlinear predistorter 58, and predistorted communication signal 60.

FIG. 3 denotes that inversing transform section 106 is characterized by a nonlinear transform having a function name of "$F^{-1}$", which desirably corresponds to the inverse of "F", the nonlinear transform for memoryless component 96. Inversing transform section 106 need not implement a mathematically precise inverse of F in all regards. In the preferred embodiment, $F^{-1}$ is desirably a gain-normalized inverse of F. Linear predistorter and AGC section 62 (FIG. 2) may operate to cause amplifier to appear as though it has a gain of around one. This gain normalization is desirable because it allows communication signals 54, 60, and 105 feedback signal 78, and error signal 90 to be processed with greater resolution for a given amount of computational resources. And, nonlinear transform $F^{-1}$ operates on the communication signal while at baseband while amplifier 70 operates on the communication signal at RF, but the downconversion which takes place at ADC 82 (FIG. 2) makes error signal 90, which is derived from amplified RF signal 76, appear to be at baseband to nonlinear predistorter 58. Thus, nonlinear transform $F^{-1}$ implemented in inversing transform section 106 is desirably a gain-normalized inversing transform which would be a substantially accurate inverse of F if F exhibited a nominal linear gain of one and operated on a baseband version of the communication signal. And, in one embodiment, the gain influence of a static portion of memory components 98 may be compensated in inversing transform section 106, again causing the inversing transform of section 106 to deviate from a mathematically precise inverse of "F" for memoryless component 96 to a small extent.

The same form of communication signal 54 provided to delay element 102 also drives an input of an inversing transform processing section 106'. An output of inversing transform processing section 106' produces communication signal 54 in a stronger form 54' and couples to an input of a non-inversing transform processing section 108. The inversing transform implemented in section 106' is desirably as nearly identical to the inversing transform implemented in section 106 as possible. In other words, it is desirably the gain-normalized inverse of F. An output of non-inversing transform processing section 108 produces communication signal 54 in a weaker form 54" and couples to a negative input of combiner 104 in amp-inversing processing section 100 as well as a control input of adaptive control section 112. Together inversing transform processing section 106' and non-inversing transform processing section 108 form a residual cancellation section 110. An adaptive control section 112 also receives error signal 90 and delayed communication signal 92 and processes signals 90, 92, and 54" to generate configuration parameters for both inversing processing sections 106 and for non-inversing processing section 108.

As discussed above, memoryless component 96 of amplifier model 94 exhibits a basic gain far greater, and preferably more than 16 dB greater, than the gain associated with memory components 98. As inversing and non-inversing transforms, inversing transform 106' and non-inversing transform 108 are mutually configured to accommodate this feature of components 96 and 98. This causes communication signal 54", produced from the cascaded operation of inversing transform 106' and non-inversing transform 108, to likewise be attenuated relative to communication signal 54, and to preferably be attenuated at least 16 dB relative to communication signal 54. Thus, residual cancellation section 110 attenuates the communication signal it processes, and the terms combined with communicated signal 54 at combiner 104 to form combined communication signal 105 are attenuated terms.

The following discussion concerns the operation of residual cancellation section 110. First, assume:

$$F[F^{-1}[x]] \cong x \qquad \text{Eq. 1}$$

where,
F is the nonlinear transform for memoryless component 96,
$F^{-1}$ is the inverse or gain-normalized inverse of F applied in section 106, and
x is provided by communication signal 54.

Eq. 1 implies that a residual cancelling perturbation signal 54" may be added to the communication signal and that residual cancelling perturbation signal 54" will appear in amplified RF signal 76. Thus, it is desirable to identify what else appears in amplified RF signal 76, due to memory components 98, and to set the residual cancelling perturbation signal 54" to effectively cancel out this unwanted memory component 98 influence.

Now, amplified RF signal 76 may be expressed as follows:

$$z(n)=F[F^{-1}[y(n)]]+G[F^{-1}[y(n)]] \cong y(n)+G[F^{-1}[y(n)]], \qquad \text{Eq. 2}$$

$$y(n)=x(n)-G[F^{-1}[x(n)]], \text{ so,} \qquad \text{Eq. 3}$$

$$z(n)=x(n)-G[F^{-1}[x(n)]]+G[F^{-1}[x(n)-G[F^{-1}[x(n)]]]]. \qquad \text{Eq. 4}$$

where,
z(n) represents amplified RF signal 76,
y(n) represents combined communication signal 105,
x(n) represents communication signal 54, and
G is the nonlinear transform for memory components 98.
But, because G is a weak, highly attenuating operator, $$G[F^{-1}[x(n)-G[F^{-1}[x(n)]]]] \cong G[F^{-1}[x(n)]]. \qquad \text{Eq. 5}$$

Consequently, by combining Eqs. 4 and 5, to a good approximation, $$z(n) \cong x(n). \qquad \text{Eq. 6}$$

Accordingly, to the extent that $F^{-1}$, implemented in inversing transform section 106, is a good approximation of the normalized inverse of F, then inversing transform section 106 linearizes memoryless component 96. And to the extent that $F^{-1}$ is a good approximation of the normalized inverse of F and that $G_{EST}$, implemented in residual cancellation section 110 and non-inversing transform section 108, is a good approximation of G, residual cancellation section 110 generates a residual cancelling perturbation signal 54" that, when combined into combined communication signal 105 linearizes memory components 98. Due to the attenuated nature of G relative to F, residual cancelling perturbation signal 54" cancels the influences of memory components 98 but also introduces another unwanted residual that is even further attenuated.

Figure 4:
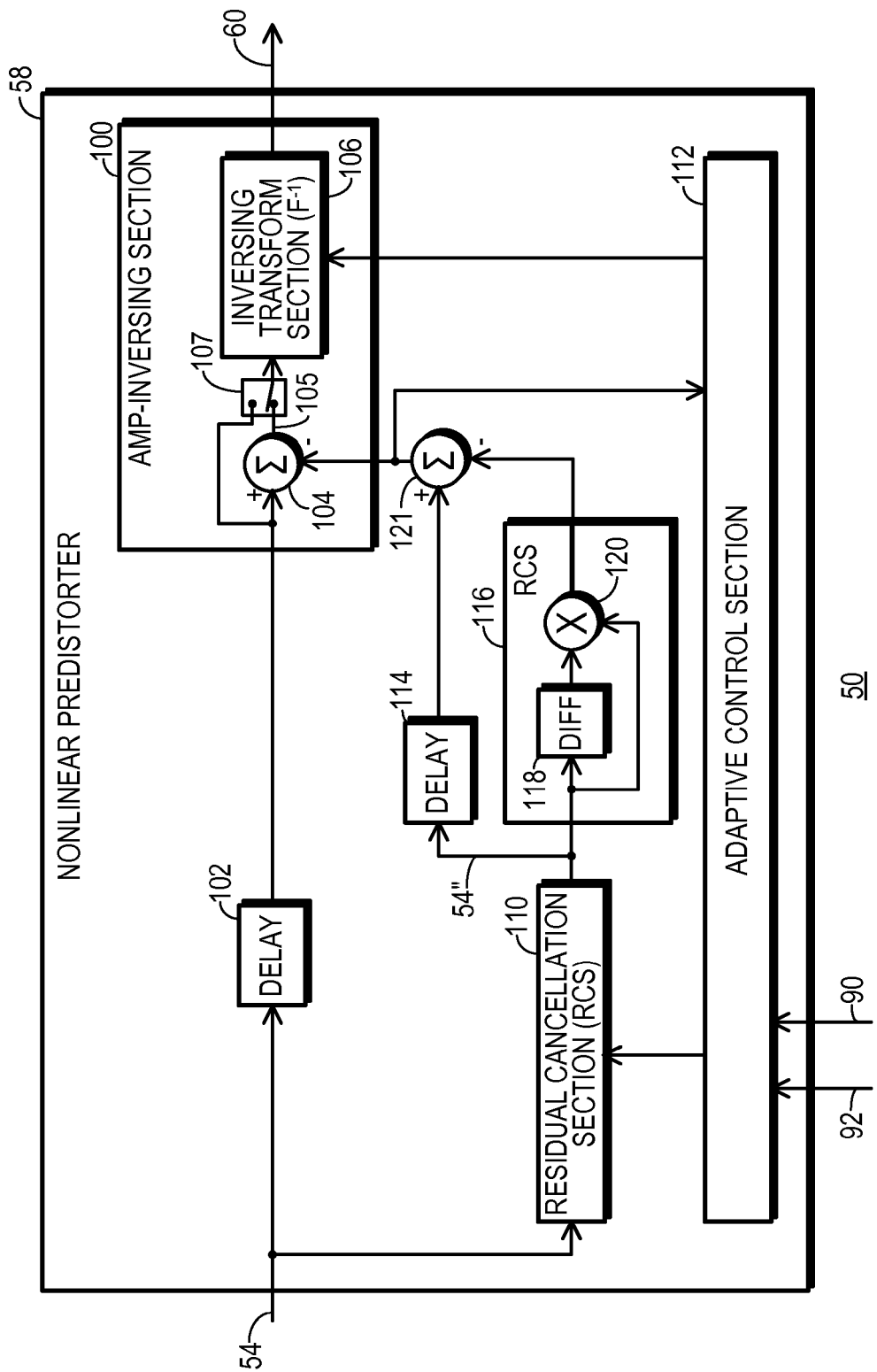
FIG. 4 shows a block diagram of a second embodiment of the nonlinear predistorter depicted in FIG. 3.

FIG. 4 shows a block diagram of a second embodiment of nonlinear predistorter 58. This second embodiment of nonlinear predistorter 58 differs from the first embodiment shown in FIG. 3 by the inclusion of a second residual cancellation section (RCS). In particular, weaker communication signal 54" provided by residual cancellation section 110 drives a delay element 114 and an input of a residual cancellation section 116. After delay in delay element 114, weaker communication signal 54" is presented to a positive input of a combiner 121, where the output of combiner 121 couples to the negative input of combiner 104 in amp-inversing processing section 100 and to a control input of adaptive control section 112. A still weaker communication signal is provided at an output of residual cancellation section 116 and drives a negative input of combiner 121. Delay elements 102 and 114 are configured so that the communication signals input to combiners 104 and 121 are temporally aligned at combiner 104. Combiners 104 and 121 now combine the still weaker communication signal with weak communication signal 54" and communication signal 54 in combined communication signal 105. Combiners 104 and 121 cause combined communication signal 105 to combine said weaker communication signal 54" and the still weaker communication signal at opposing polarities.

In particular, residual cancellation section 110 is desirably configured as shown and discussed above in connection with FIG. 3. The communication signal output from residual cancellation section 110 is applied at a differentiator (DIFF) 118 in residual cancellation section 116 and a first input of a multiplier 120. An output of differentiator 118 couples to a second input of multiplier 120, and an output of multiplier 120 serves as the output from residual cancellation section 116. Residual cancellation section 116 need include no more processing resources than a differentiator and a multiplier. Processing resources which may be used in implementing residual cancellation section 110, including inversion transform section 106' and non-inversing transform section 108, are discussed below.

The following discussion concerns the operation of residual cancellation section 116. With reference to Eq. 2 above, let a new function, w, be represented as the composite of the functions G and $F^{-1}$, as follows:

$$w(x) \equiv (G \circ F^{-1})(x) = G(F^{-1}(x)) \qquad \text{Eq. 7}$$

Thus, Eq. 7 describes the operation of the signal path that passes through inversing transform section 106 and memory components 98 or, to the extent that $G_{EST}$ is an accurate approximation of G, the signal path that passes through inversing transform 106' and non-inversing transform section 108. Using Eq. 7, amplified RF signal 76, z(n), may now be expressed as follows:

$$Z(n) = F[F^{-1}[y(n)]] + G[F^{-1}[y(n)]] \cong y(n) + w[y(n)], \qquad \text{Eq. 8}$$

$$y(n) = x(n) - w[x(n)], \text{ so,} \qquad \text{Eq. 9}$$

$$z(n) = x(n) - w[x(n)] + w[x(n) - w[x(n)]]. \qquad \text{Eq. 10}$$

Dropping the explicit notational dependence on the time index, n, Eq. 10 becomes $$z = x - w[x] + w[x - w[x]]. \qquad \text{Eq. 11}$$

Approximating the latter term of Eq. 11 by the first term of the Taylor series expansion, $$w[x - w(x)] \approx w(x) - w'(x)w(x). \qquad \text{Eq. 12}$$

Consequently, Eq. 11 may be closely approximated as:

$$z = x - w'[x]w[x] \approx x. \qquad \text{Eq. 13}$$

Thus, differentiator 118 and multiplier 120 in residual cancellation section 116 perform the derivative function and product of Eq. 13 to generate an improved accuracy residual cancelling perturbation signal.

Figure 5:
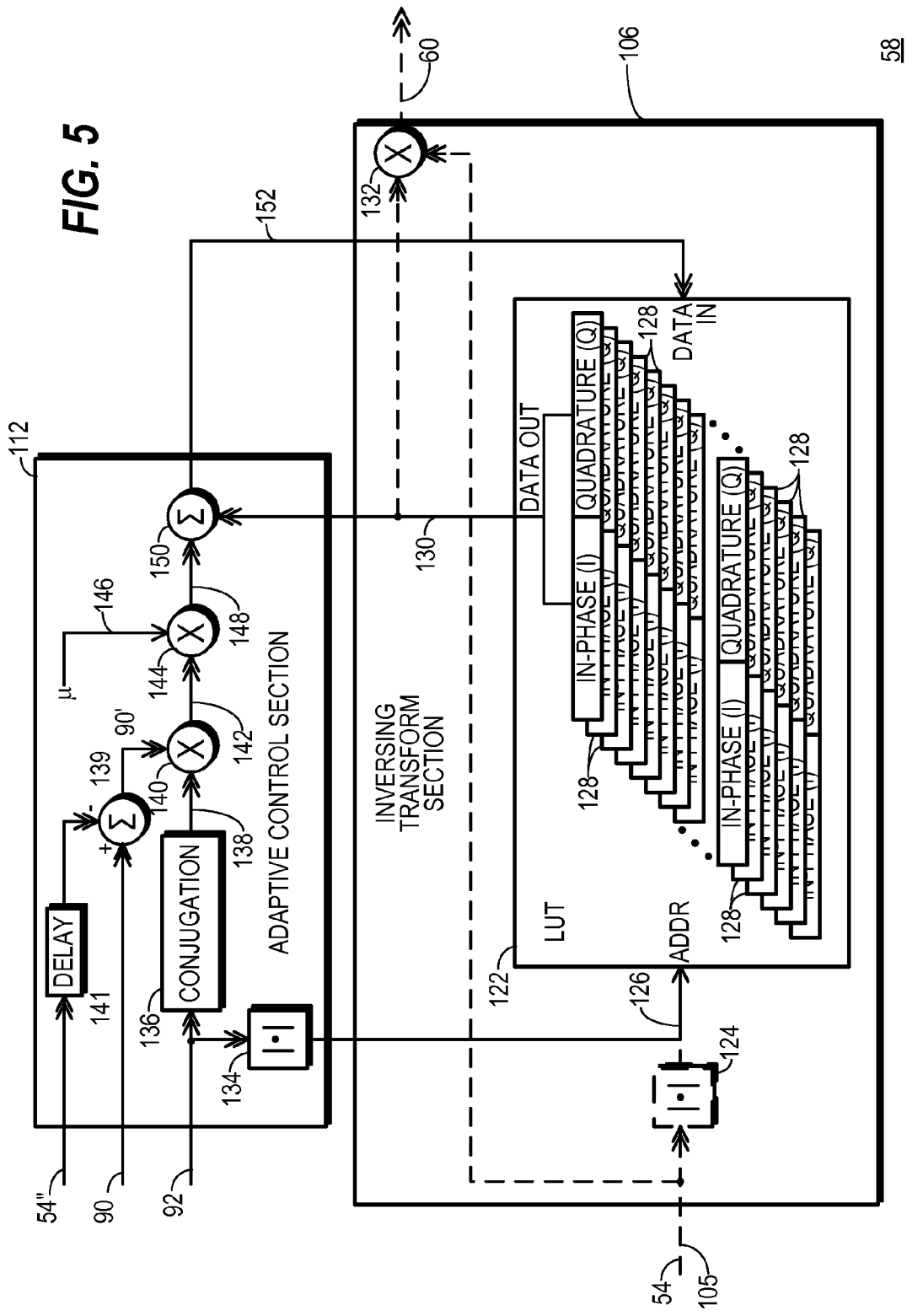
FIG. 5 shows a block diagram of an inversing transform section and an adaptive control section of the nonlinear predistorter depicted in FIG. 3.

FIG. 5 shows a block diagram of inversing transform section 106 and a portion of adaptive control section 112 from nonlinear predistorter 58. In FIG. 5, the complex nature of the communication signals processed in nonlinear predistorter 58 are specifically denoted with a double-arrowhead notation. Inversing transform section 106 desirably implements a form of gain-based predistortion that uses a look-up table (LUT) 122.

In one embodiment, separate LUTs are used in implementing the separate sections 106 and 106' (FIG. 3). In another embodiment, the same LUT is used for implementing both of sections 106 and 106', perhaps using a dual-port or multiport memory and multiplexing techniques. The following discussion and FIG. 5 concern an embodiment in which inversing transform sections 106 and 106' have a master-slave relationship, with inversing transform section 106 (the master) being updated, then its programming or training copied to a similarly configured inversing transform section 106' (the slave) from time to time. Thus, the structure of inversing transform section 106 depicted in FIG. 5 may also apply for inversing transform section 106'. But in an alternate embodiment, a dual-port memory may be used to implement the LUT, with the same updates being available to inversing transform sections 106 and 106' simultaneously.

From the perspective of a look-up operation, or read memory access cycle, a communication signal is applied to inverse transforming section 106 at a magnitude extraction section 124. Communication signal 54, depicted in FIG. 5 using dotted lines, is applied when operating in the above-discussed inversing transform update mode, and communication signal 105 is applied when operating in the above-discussed normal mode, as controlled by mode switch 107 (FIG. 3). Magnitude extracting section 124 determines the magnitudes, or an equivalent magnitude-based parameter, of the stream of complex samples which form the communication signal, and provides a magnitude signal 126 to an address input of LUT 122.

Desirably, LUT 122 is organized to include a multiplicity of data entries 128, with different data entries 128 corresponding to different magnitude values that may be presented to the address input of LUT 122. Each data entry is desirably configured as a complex value represented using the Cartesian coordinate system to have a real, or in-phase, and an imaginary, or quadrature, component. During each look-up operation, the addressed data entry 128 is provided at a data output of LUT 122 and referred to herein as an outgoing data entry 130.

The communication signal samples to which the outgoing data entries 130 are responsive are routed to a first input of a multiplier 132 and the corresponding outgoing data entries 130 are routed to a second input of multiplier 132, as shown using a dotted line notation in FIG. 5. Thus, outgoing data entries 130 function to apply a complex gain to the communication signal input at inversing transform section 106, and the precise value of that complex gain is determined by translating a magnitude parameter of the communication signal through a table look-up operation. Desirably, these operations all take place in accordance with mathematical operations carried out using the Cartesian coordinate system. An output of multiplier 132 provides predistorted communication signal 60 as the output from inversing transform section 106.

Data entries 128 for LUT 122 are calculated by adaptive control section 112, which implements a continuous process control loop that processes amplified RF signal 76 output by amplifier 70 as it becomes available. No batch or block of samples is collected and then processed as a unit. In one embodiment (not shown), adaptive control section 112 implements a conventional least-means-squared (LMS) algorithm. In this embodiment, adaptive control section 112 performs conversions between Cartesian and polar coordinate systems in making its calculations. Alternatively, adaptive control section 112 may implement a conventional LMS algorithm using the secant method, which requires the performance of division operations.

FIG. 5 depicts a preferred embodiment of a continuous process control loop in which adaptive control section 112 implements a modified LMS algorithm. In the modified LMS algorithm of the FIG. 5 embodiment, a conventional LMS algorithm has been modified in a way that avoids the use of conversions between Cartesian and polar coordinate systems and also avoids division operations.

Referring to FIG. 5, from the perspective of an update operation, or write cycle for LUT 122, a communication signal is applied to control section 112 at a magnitude extraction section 134. Desirably, magnitude extraction section 134 performs the same function as is performed by magnitude extraction section 124. For the update operation, this communication signal is a delayed version of communication signal 54, such as delayed communication signal 92. In an alternate embodiment, magnitude extraction section 134 may be omitted, and the output of magnitude extraction section 124, appropriately delayed, and used in lieu of section 134. Communication signal 92 is also provided to a conjugation section 136. Conjugation section 136 implements a conjugation operation, which in the Cartesian coordinate system can be performed by negating the imaginary component of each complex sample. Conjugation section 136 provides a conjugated communication signal 138 that is responsive to communication signal 92. Conjugated communication signal 138 drives a first input of a multiplier 140.

Error signal 90 (also shown in FIG. 3) drives a positive input of a combination circuit 139, and weaker communication signal 54" (also shown in FIG. 3) drives a negative input of combination circuit 139 through a delay element 141. An output of combination circuit 139 generates a residual-compensated error signal 90', which drives a second input of multiplier 140. Delay element 141 is configured to delay weaker communication signal 54" into time alignment with error signal 90 at combination circuit 139. Although not shown, additional delay may be inserted upstream of either the first or second input of multiplier 140 as necessary so that corresponding samples from conjugated communication signal 138 and residual-compensated error signal 90' are aligned in time at multiplier 140.

As shown in FIG. 3 and discussed above, error signal 90 is responsive to amplified RF signal 76 through feedback signal 78. In particular, error signal 90 is responsive to a difference between delayed communication signal 92 and amplified RF signal 76, as expressed through feedback signal 78. This generally represents the portion of amplified RF signal 76 (FIG. 3) that differs from its ideal configuration. To the degree that $F^{-1}$ implemented in inversing transforming sections 106 and 106' is an accurate inverse of F in amplifier model 94, and that $G_{EST}$ implemented in non-inversing transform section 108 is an accurate non-inversing estimate of G in amplifier model 94, residual-compensated error signal 90' generally represents that portion of the output from memoryless component 96 of amplifier model 94 that differs from its ideal configuration. Multiplier 140 correlates conjugated communication signal 138 with error signal 90 to produce a raw correlation signal 142. Multiplier 140 desirably performs its complex multiplication operation using the Cartesian coordinate system.

Raw correlation signal 142 is received at a two-quadrant complex multiplier 144 along with a scaling constant 146, which is labeled using the variable "μ" in FIG. 5. An output from multiplier 144 generates a scaled correlation signal 148. In the preferred embodiment, multiplier 144 is implemented using the Cartesian coordinate system.

Scaling constant 146 determines how much influence each sample from raw correlation signal 142 will exert on an updated data entry 128 for LUT 122. Greater influence is associated with faster but less stable convergence for LUT 122, more noise represented in data entries 128 of LUT 122, and a faster loop bandwidth for the continuous process control loop that updates data entries 128. Scaling constant 146 is desirably chosen to implement a relatively narrow loop bandwidth. This loop bandwidth establishes the tracking period over which memoryless component 96 of amplifier model 94 (FIG. 3) is measured. Thus, this tracking period discussed above in connection with memoryless component 96 is relatively slow so that influences of memory components 98 (FIG. 3) occur on a faster time scale and so that the updating of data entries 128 remains substantially unresponsive to the influences of memory components 98.

However, scaling constant 146 need not be completely time invariant. For example, a faster loop bandwidth may be initially chosen to quickly populate LUT 122 with data entries 128, then the loop bandwidth may be slowed. And, scaling constant 146 may be set to zero for extended periods when desirable to prevent data entries 128 from changing. For example, scaling constant 146 may be set to zero while transmitter 50 is not actively transmitting, and scaling constant 146 may be set to zero while other control loops within transmitter 50 are converging, such as during the normal mode of operation, to prevent coupling between the control loops.

Scaled correlation signal 148 drives a first positive input of a combiner 150. A second positive input of combiner 150 receives outgoing data entries 130 from LUT 122. For each sample of scaled correlation signal 148, the outgoing data entry 130 provided to combiner 150 from LUT 122 corresponds to the sample of communication signal 92 to which the scaled correlation signal 148 sample also corresponds. A magnitude parameter for that sample from communication signal 92 serves as an address to LUT 122 to cause LUT 122 to produce the corresponding data entry 130.

Desirably, combiner 150 performs a Cartesian coordinate system addition operation. An output of combiner 150 couples to a data input port of LUT 122 and provides incoming data entries 152 for storage in LUT 122. The incoming data entry 152 is stored at the same memory address from which the corresponding outgoing data entry 130 was previously stored. The incoming data entry 152 is expressed in the Cartesian coordinate system.

Accordingly, adaptive control section 112 is configured to calculate incoming data entries 152 without performing complex conversions between Cartesian and polar coordinate systems and without performing a division operation. This allows nonlinear predistorter 58 to implement an inversing transform, $F^{-1}$, in a gain-based LUT predistorter using fewer computational resources. The accuracy of the inversing transform $F^{-1}$ is improved due the use of a relatively narrow loop bandwidth, and the ability to implement a relatively narrow loop bandwidth is improved by the elimination of conversions between Cartesian and polar coordinate systems and division operations. In addition, accuracy is further improved by de-embedding the influences of memory components 98 from residual-compensated error signal 90'.

The embodiment of adaptive control section 112 depicted in FIG. 5 provides adequate performance for many applications. But scaled correlation signal 148, which is added to outgoing data entries 130 to form incoming data entries 152, is a function of signal magnitude. Accordingly, scaling constant 146 is set at a low level to achieve stability for the data entries 128 of the highest magnitudes. This causes data entries 128 for all lower magnitudes of the communication signal to exhibit extreme stability and to converge slower than necessary.

Figure 6:
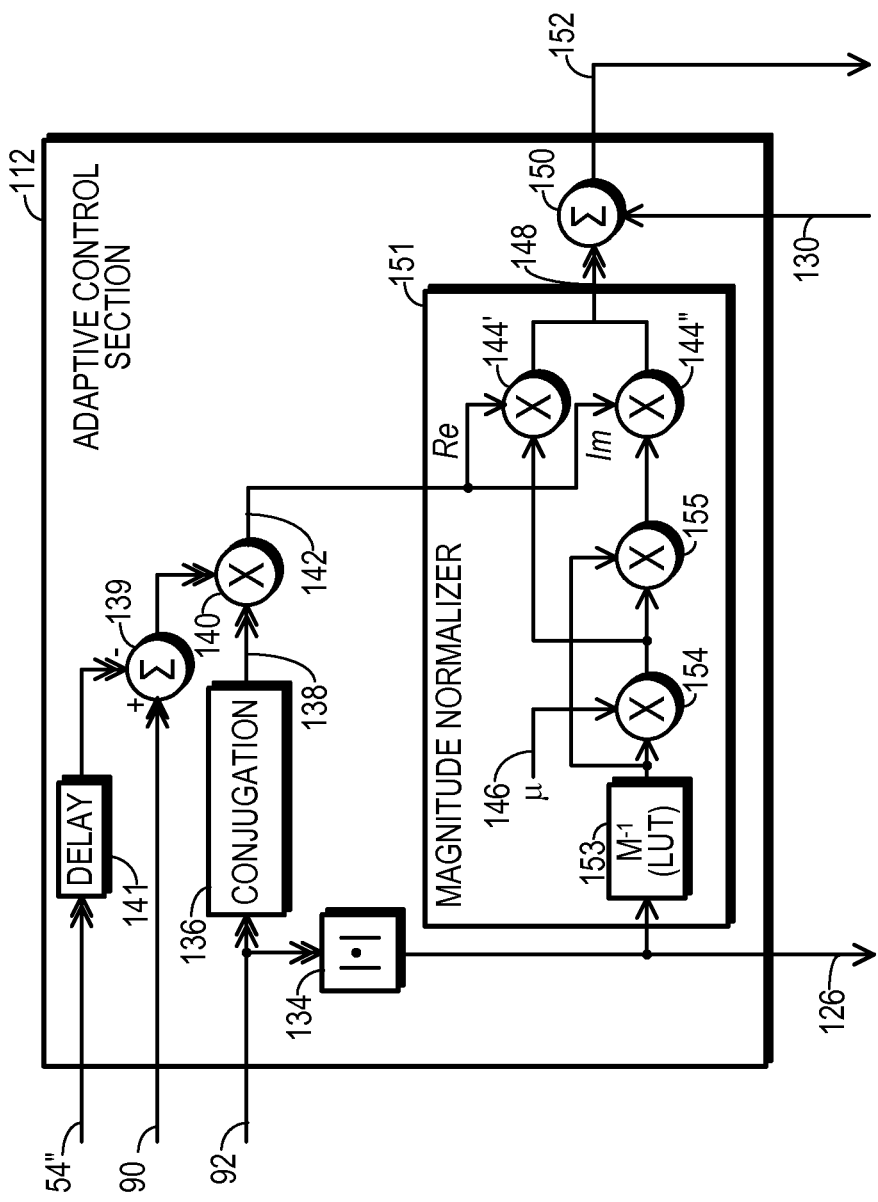
FIG. 6 shows a block diagram of a second embodiment of the adaptive control section of FIG. 5.

FIG. 6 shows a block diagram of a second embodiment of adaptive control section 112. This second embodiment improves convergence speed by normalizing the magnitude influence on scaled correlation signal 148 so that data entries 128 for all magnitudes of the communication signal exhibit about the same stability and converge at about the same rate.

This second embodiment of adaptive control section 112 uses a magnitude normalizer 151 in lieu of two-quadrant multiplier 144 depicted in FIG. 5. All other components of adaptive control section 112 are the same as depicted in FIG. 5. Magnitude normalizer 151 has a first input coupled to the output of magnitude extraction section 134 to receive magnitude signal 126. Magnitude signal 126 drives an inversing section 153 that determines the inverse of magnitude signal 126. Preferably, inversing section 153 is formed using a look-up table (LUT) to avoid the need of performing division operations. But the LUT may be addressed by only the more significant bits of magnitude signal 126 and therefore have far fewer data entries than are included in LUT 122.

An output of inversing section 153 drives a first input of a multiplier 154 and a first input of a multiplier 155. Scaling constant 146 (μ) is supplied to a second input of multiplier 154, and an output of multiplier 154 drives a second input of multiplier 155. Multipliers 154 and 155 may be implemented using one-quadrant multipliers. An output of multiplier 154 also drives a first input of a multiplier 144' and an output of multiplier 155 drives a first input of a multiplier 144". A real portion of raw correlation signal 142 drives a second input of multiplier 144', and an imaginary portion of raw correlation signal 142 drives a second input of multiplier 144". Multipliers 144' and 144" are one-quadrant multipliers, and their outputs are combined to form scaled correlation signal 148, discussed above.

Through the inversing operation of inversing section 153, the magnitude influence in scaled correlation signal 148 is normalized. In particular, the magnitude influence is squared for the imaginary portion of complex scaled correlation signal 148, and applied linearly for the real portion of complex scaled correlation signal 148. Thus, the real portion scaled correlation signal 148 is normalized by the inverse of the magnitude through the operation of multiplier 154, and the imaginary portion is normalized by the inverse of the magnitude squared through the operation of multipliers 154 and 155. By normalizing magnitude dependence, all updates to data entries 128 in LUT 122 (FIG. 5) exhibit substantially the same stability and convergence rate.

Figure 7:
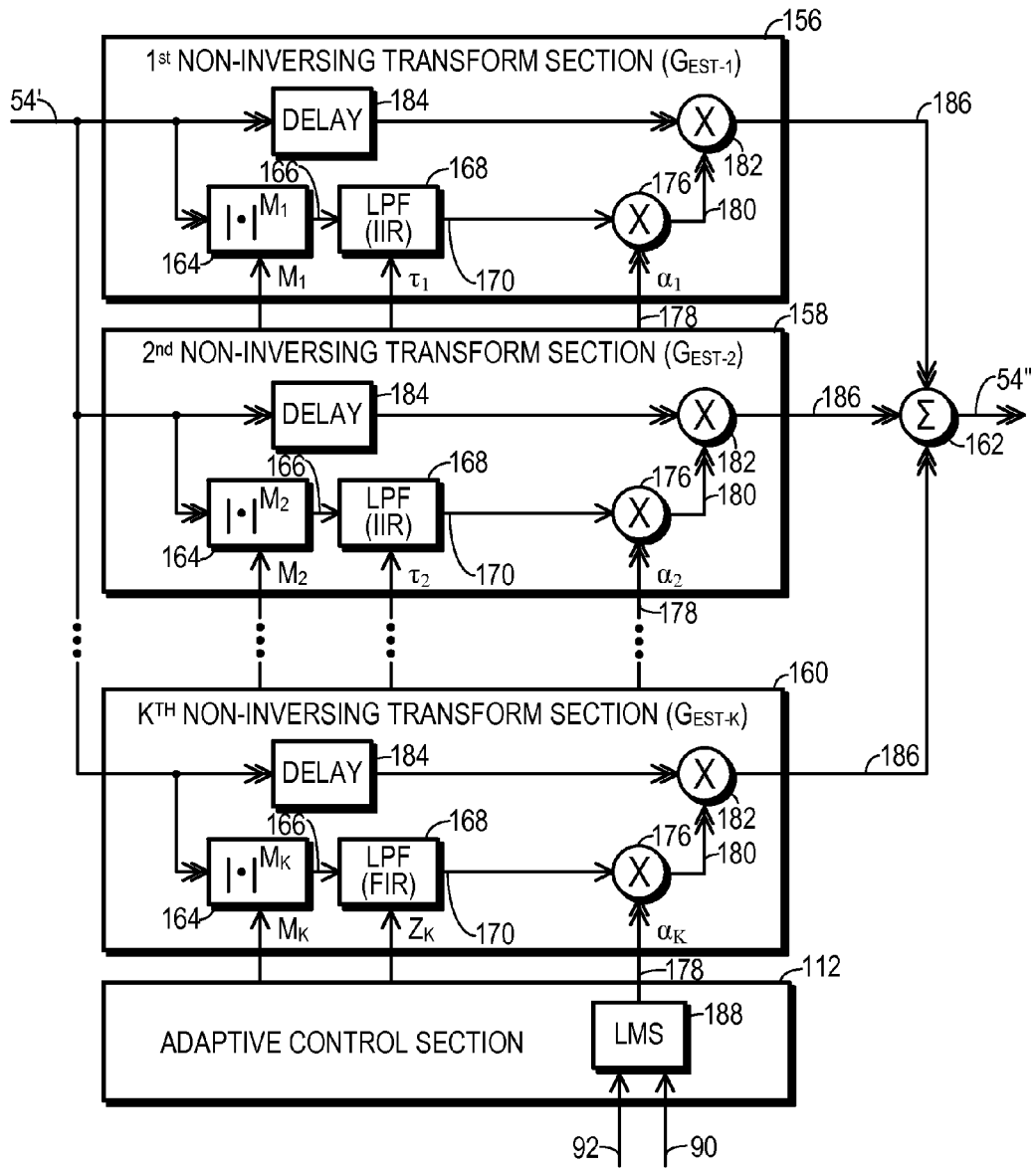
FIG. 7 shows a block diagram of a non-inversing transform section of the nonlinear predistorter depicted in FIG. 3.

FIG. 7 shows a block diagram of non-inversing transform sections that are implemented by one embodiment of nonlinear predistorter 58 (FIG. 3). In FIG. 7, complex signals are specifically denoted with a double-arrowhead notation. While FIG. 3 shows the inclusion of a single non-inversing transform section 108, FIG. 7 depicts the use of three non-inversing transform processing sections 156, 158, and 160. Any one of sections 156, 158, and 160 may serve as non-inversing transform section 108 in FIG. 3. Or, all of sections 156, 158, and 160, or any subset of sections 156, 158, and 160 may collectively serve as non-inversing transform section 108 in FIG. 3. And, while FIG. 7 depicts the inclusion of three non-inversing transform sections 156, 158, and 160, that number may be expanded in alternate embodiments. The communication signals output by each of sections 156, 158, and 160 are combined together at an adder 162 when more than one of sections 156, 158, and 160 are present to form weaker communication signal 54".

In general, each of sections 156, 158, and 160 is provided to characterize a different memory nonlinearity included in memory components 98 in amplifier model 94 (FIG. 3). In other words, sections 156, 158, and 160 having a configuration that may be viewed as modeling different memory components 98. Typical nonlinearities included in memory components 98 may include a thermal nonlinearity associated with the die on which amplifier 70 is formed, a thermal nonlinearity associated with the packaging used to house amplifier 70, one or more electrical nonlinearities associated with the biasing and feed networks for amplifier 70, and the like. Desirably, non-inversing transform sections are provided to address the most significant ones of such nonlinearities.

Each of processing sections 156, 158, and 160 may be configured similar to the others. Thus, for each of sections 156, 158, and 160 stronger communication signal 54' (FIG. 3) is supplied to a magnitude-extracting section 164. Magnitude-extracting section 164 determines the magnitude of communication signal 54' raised to an integral power $M_K$, where "K" identifies the section 156, 158, or 160 and $M_K$'s need not be equal among the sections 156, 158, and 160. The precise integral power is a configuration parameter specified by adaptive control section 112. In a typical application, $M_K$ values may be limited to an integer within the range of 1-7.

Magnitude-extracting section 164 generates a magnitude based signal 166 that drives filtering section 168. Filtering section 168 is desirably configured to implement a low-pass filter (LPF). The parameters which define the characteristics of filtering section 168 are provided by adaptive control section 112. Desirably, these parameters are selected in combination with the exponent parameter $M_K$ to simulate a particular nonlinearity for amplifier 70.

The form of low-pass filter implemented in filtering section 168 may vary between sections 156, 158, and 160. As an example, FIG. 7 depicts sections 156 and 158 implementing an infinite-impulse response (IIF) filter and section 160 implementing a finite-impulse (FIR) filter. Desirably, a form is chosen that best and most simply characterizes a specific simulated nonlinearity of amplifier 70. In one embodiment, an IIR form is chosen to simulate thermal nonlinearities and an FIR form is chosen to simulate electrical nonlinearities.

Filtering section 168 generates a filtered magnitude based signal 170 that drives a complex scaling section 176. Scaling section 176 scales filtered magnitude based signal 170 to exhibit a magnitude and phase that minimizes the influence of the target nonlinearity. This scaling operation is performed by multiplying filtered magnitude based signal 170 by a complex constant 178, also referenced by the label "a" in FIG. 7, supplied from adaptive control section 112.

Scaling section 176 generates a scaled and filtered signal 180 that drives a first input of a multiplying section 182. Communication signal 54', which drives magnitude-extracting section 164, also drives a second input of multiplying section 182, after an appropriate delay in a delay element 184. Delay element 184 inserts a delay to compensate for the processing delay of processes that model instantaneous behaviors of amplifier 70, such as magnitude extraction. Multiplying section 182 generates a magnitude-shaped communication signal 186 which serves as the output from the non-inversing transform section 150, 158, or 160. When only a single non-inversing transform section is included in nonlinear predistorter 58, then magnitude-shaped communication signal 186 also serves as weaker communication signal 54" (see FIG. 3). But when more than one non-inversing transform section is included, the different magnitude-shaped communication signals 186 are added together in adder 162 to form communication signal 54".

As discussed above, adaptive control section 112 supplies configuration parameters for non-inversing transform sections 156, 158, and 160. These parameters are determined in response to a continuous process control loop that processes amplified RF signal 76 output by amplifier 70 as it becomes available. No batch or block of samples is collected and then processed as a unit.

These parameters are calculated in response to delayed communication signal 92 and error signal 90 (FIG. 3). A portion of adaptive control section 112 implements a classic LMS algorithm 188 in response to delayed communication signal 92 and error signal 90 to calculate complex constants 178. Control section 112 may also use an LMS algorithm to calculate zeros for filtering section 168 when filtering section 168 implements a FIR filter.

In one embodiment a high-pass filter (not shown) is inserted between filtering section 168 and complex scaling section 176. This filter removes the static portion of the target memory nonlinearity, causing that static portion to be compensated through inversing transform sections 106 and 106' (FIG. 3). In some applications this may be desirable, at least until a reasonably accurate $G_{EST-K}$ estimate has been determined, because this static portion of memory components 98 is embedded with memoryless component 96 when inversing transform sections 106 and 106' are being formed.

Figure 8:
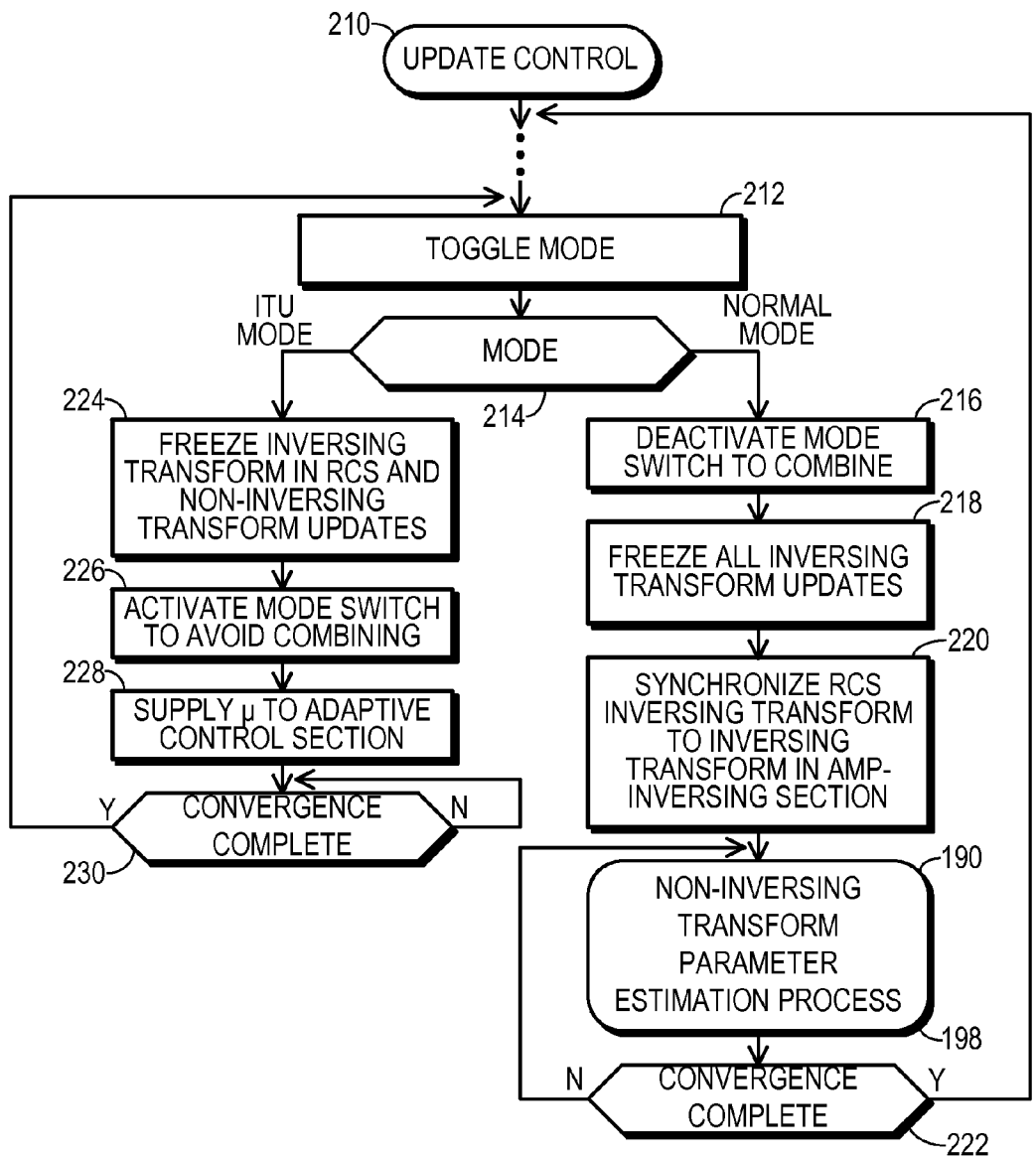
FIG. 8 shows a flow chart for a process for controlling the updating of inversing and non-inversing transform sections of the nonlinear predistorter depicted in FIG. 3.

FIG. 8 shows a flow chart for a process 210 for controlling the updating of inversing and non-inversing transform sections of nonlinear predistorter 58. Control section 112 is configured to include processing elements, such as a microprocessor, DSP, microcontroller, state machine, or the like, which implements process 210 in a manner understood to those skilled in the art.

As indicated by ellipsis in FIG. 8, any number of tasks may be performed during process 210 prior to a task 212, which toggles an operational mode for transmitter 50 between the normal mode and the inversing transform update (ITU) mode. For example, process 210 may evaluate the back-off bias level at which amplifier 70 is being operated and alter the back-off level. During the normal mode, LUT 122 (FIG. 5) is not being updated, but is being used to provide an inversing transform $F^{-1}$ which is desirably as accurate an inverse of memoryless component 96 (F) as is practical. During the inversing transform update mode, LUT 122 is being updated and also being used to provide an inversing transform $F^{-1}$. After task 212, a query task 214 determines which mode applies. If the normal mode is detected, a task 216 then deactivates mode switch 107 (FIG. 3) so that combined communication signal 105 drives inversing transform section 106.

Following task 216, a task 218 freezes all inversing transform updates, if not otherwise frozen. Task 218 may be implemented by setting scaling constant 146 (FIGS. 5-6) to zero. Then, a task 220 is performed to synchronize inversing transform section 106' with inversing transform section 106 (FIG. 3). Inversing transform section 106' is located in residual cancellation section 110 (FIG. 3) while inversing transform section 106 is located in amp-inversing section 100 (FIG. 3). Synchronization may be performed by copying data entries 128 from one LUT 122 to another LUT 122. But in an embodiment where a single LUT 122 is multiplexed between inversing transform sections 106 and 106', task 220 may be omitted. After task 220, a process 190 is performed to estimate parameters for non-inversing transform processing sections 156, 158, and 160 (FIG. 7).

Figure 9:
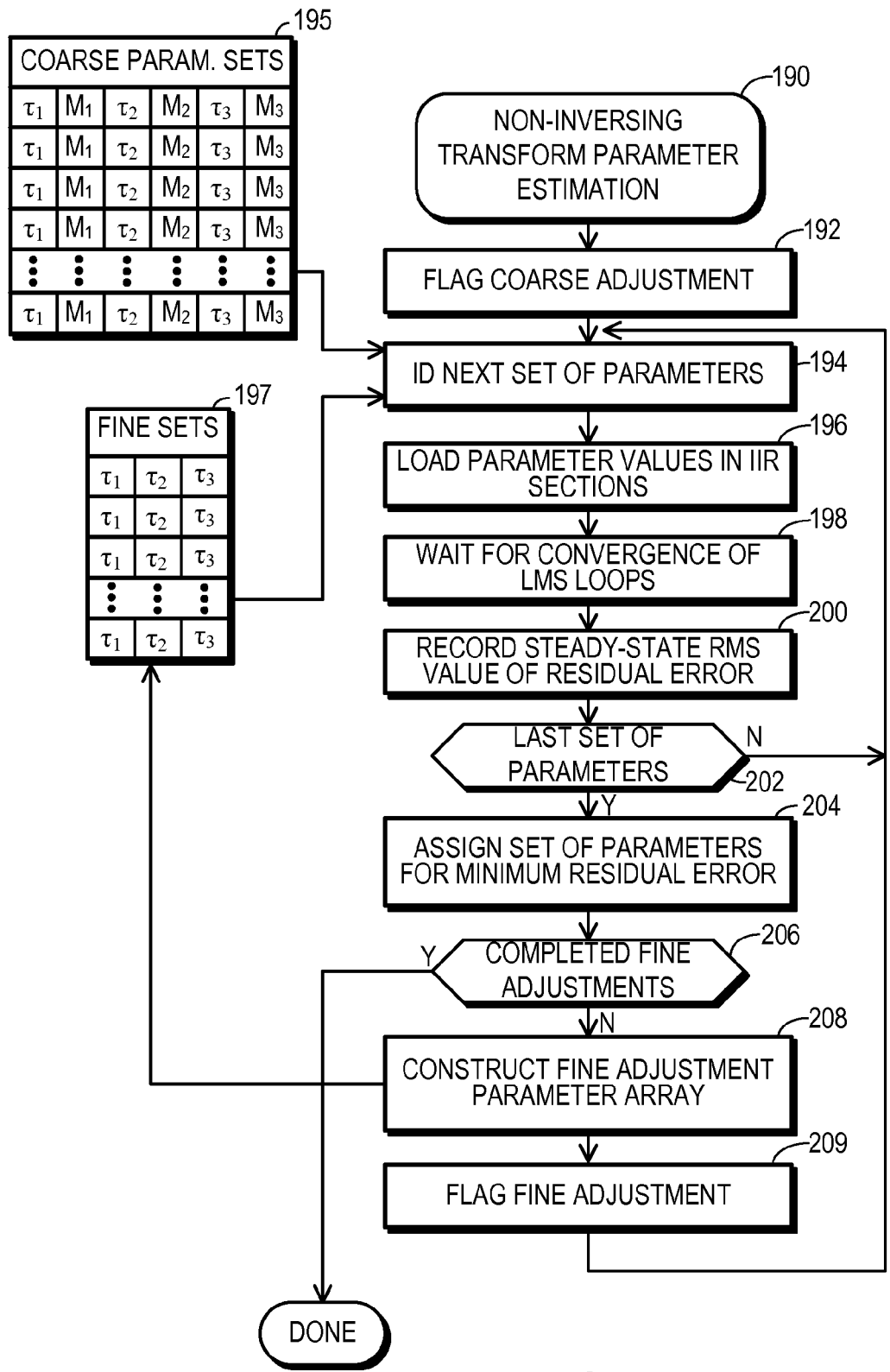
FIG. 9 shows a flow chart of a process for estimating parameters for non-inversing transform implemented by the nonlinear predistorter depicted in FIG. 3.

FIG. 9 shows a flow chart of non-inversing transform parameter estimation process 190 performed by adaptive control section 112. Referring to FIG. 9, process 190 may be configured to perform a variety of tasks to appropriately set the configuration parameters for non-inversing transform sections 156, 158, and 160. These tasks implement an algorithm that scans a range of exponent values, and time constants to simultaneously determine, for all IIR-based non-inversing processing sections, where minimized residual error is observed in error signal 90.

In particular, process 190 performs a task 192 in which an adjustment phase flag is set to indicate that a coarse adjustment phase is being performed in process 190. Then, a task 194 identifies a next set of parameters to evaluate for this adjustment phase.

In one embodiment, exponent values ($M_K$) may be limited to the few integer values of 1, 2, 3, ... and so on. Likewise, time constants ($\tau_K$) may be limited to a few logarithmically related values. For example, the set of time constants: [0.3, 0.75, 1.88, 4.69, 11.7, 29.3, 73.2 µsec] are logarithmically related by a factor of 2.5 and cover the time span of from 0.3 to 73.2 µsec. Desirably, an array 195 of coarse parameter sets is constructed where each parameter set has one exponent-value/time-constant pair for each IIR-type non-inversing transform section 156, 158, and 160 included in nonlinear predistorter 58 (FIG. 7). FIG. 9 depicts an exemplary array 195 having three of such pairs in each parameter set. All combinations of parameter pairs are represented in array 195, taken three pairs at a time in this example. But array 195 may omit combinations that have the same pair included twice. Task 194 identifies a set of parameters that has not yet been evaluated from the parameter set array.

After task 194, a task 196 loads the parameters from the selected parameter set into the respective IIR sections 156, 158, and 160. Desirably, parameters for each IIR-type non-inversing transform section 156, 158, and 160 in nonlinear predistorter 58 are loaded at task 196 so that the parameters converge simultaneously. Then, a task 198 causes process 190 to wait until LMS algorithm 188 (FIG. 7) has converged on stable values for complex constants 178 in the sections 156, 158 and 160. After convergence, a task 200 records the steady-state rms value of residual error, as expressed in error signal 90, along with the parameter set ID and the converged values for complex constants 178. Then, a query task 202 determines whether the last set of parameters from the parameter set array has been evaluated. If at least one additional parameter set remains to be evaluated, programming control loops back to task 194 to evaluate the next parameter set.

Eventually, all parameter sets from the parameter set array will be evaluated by process 190. When this condition is detected at query task 202, a task 204 is performed to evaluate all recorded error results for this adjustment phase and select the parameter set that produced the minimum residual error. Task 204 also assigns the selected parameter set and its associated complex constants 178 to non-inversing transform sections 156, 158, and 160.

Following task 204, a query task 206 determines whether a fine adjustment phase has been completed. This determination may be made by evaluating the adjustment phase flag discussed above in task 192. When the fine adjustment phase is not complete, for example when the coarse parameter set array 195 was most recently evaluated, a task 208 proceeds to initialize for the fine adjustment phase.

In particular, task 208 constructs a fine adjustment parameter array 197 based on the time constants assigned above in task 204. Task 208 may assume that the coarse adjustment phase correctly identified memory exponents and thus include only time constants in fine parameter set array 197. Desirably, a new set of time constants for each of sections 156, 158, or 160 is determined. The time constants for each section 156, 158, and 160 are desirably logarithmically related and desirably span ranges centered on the time constants assigned above in task 204. Desirably, the time constant steps are smaller for fine parameter sets array 197 than for coarse parameter sets array 195. Desirably all combinations of time constants for the respective ranges are included in array 197.

Following task 208, a task 209 sets the adjustment phase flag to indicate that a fine adjustment phase is now being performed. Then, program control loops back to task 194 to evaluate the parameter sets in array 197. Task 204 in this fine adjustment phase will more precisely determine, then assign, time constants for each of non-inversing transform sections 156, 158, and 160. Then, query task 206 will detect that the fine adjust phase is complete and cause program control to exit process 190. But in an alternate embodiment, process 190 may be configured to perform the fine adjustment phase more than once, with time constants being resolved with increasing precision for each pass of the fine adjustment phase.

Referring back to FIG. 8, after the performance of process 190 a query task 222 evaluates whether the convergence of parameters for non-inversing sections 156, 158, and 160 is sufficiently complete. If task 222 determines that convergence is not complete, program control returns to process 190 to further converge the parameters. Completion may be determined in a variety of different ways. For example, little change may be seen in parameters from iteration to iteration of process 190. Little change from iteration to iteration may be seen in residual error measured in error signal 90. Or, an allotted amount of time may be given to repeating process 190. In one embodiment, transmitter 50 spends a vast majority, preferably more than 90% and more preferably more than 99.9%, of its time in the normal mode. Eventually, task 222 determines that convergence is sufficiently complete that the mode may be toggled, and program control returns to tasks 212 and 214.

In one embodiment, many, and even most, of the iterations of process 190 need not perform the complete process shown in FIG. 9 and discussed above. In this embodiment, when the complete process 190 has been performed in the recent past, then several iterations of process 190 may be performed merely by performing task 198 (FIG. 9), which allows LMS convergence loops for non-inversing sections 156, 158, and 160 to operate and further refine complex constants 178. But the complete process 190 is desirably performed from time to time during normal operation.

When task 214 determines that the mode has been toggled to the inversing transform update mode, a task 224 freezes all non-inversing transform updating, if necessary. And, task 224 may optionally freeze all inversing transform updating for residual cancellation section 110. Then, a task 226 activates mode switch 107 (FIG. 3) to pass communication signal 55 to inversing transform section 106 rather than combined communication signal 105. This action produces the effect of removing residual cancellation directed to memory components 96 from communication signal 60 (FIG. 3) and amplified RF signal 76. On the other hand, any unwanted bias in communication signal 60 which derives from an imperfectly accurate estimate of non-inversing transform processing sections 156, 158, and 160 (FIG. 7) is removed from communication signal 60, which helps de-embed memory components 98 from memoryless component 96.

Following task 226, a suitable scaling constant 146 (FIGS. 5-6) is provided to adaptive control section 112 to unfreeze adaptation and permit convergence. As discussed above in connection with FIGS. 5-6, incoming data entries 152 that differ from outgoing data entries 130 will be generated for LUT 122. Eventually, the data entries 128 in LUT 122 will exhibit values which cause inversing transform section 106 to provide an improved estimate of the inverse of memoryless component 96 in amplifier model 94 (FIG. 3). Next, a query task 130 determines whether convergence is complete. So long as convergence is not complete, program control remains at task 230. Convergence may be measured in a variety of different ways. For example, little change may be observed in error signals 90 or 90' (FIGS. 3, 5, and 6), or an allotted amount of time may have transpired. In one embodiment, the duty cycle for the inversing transform update mode is desirably less than 10%, and preferably less than 0.1%. This low duty cycle is desirable because it minimizes the time during which memory components 98 cancellation is being omitted from communication signal 60. At a duty cycle of 0.1% any increase in error caused by omitting memory components 98 cancellation is reduced 30 dB compared to a 100% duty cycle.

When task 230 eventually determines that convergence is complete, program control returns to tasks 212 and 214 to cause operation of transmitter 50 to toggle into its normal mode. As the estimates of G in non-inversing transform sections 156, 158, and 160 become more accurate, the estimate of $F^{-1}$ in inversing transform sections 106 and 106' also becomes more accurate, and vice-versa.

In summary, at least one embodiment of the present invention provides one or more continuous process control loops that effectively linearize a transmitter. In accordance with at least one embodiment of the present invention, the transmitter is linearized using fewer processing resources than are required to implement a polynomial batch approach. In accordance with at least one embodiment of the present invention, different nonlinearity features of an amplifier are de-embedded from one another by using a predistorter that includes two instances of an inversing transform section, where one of the inversing transform sections is included in a residual cancellation section. In the residual cancellation section, the inversing transform is cascaded with a non-inversing transform to generate an attenuated signal which cancels out a stronger residual signal at the cost of introducing a more attenuated residual signal.

Although the preferred embodiments of the invention have been illustrated and described in detail, it will be readily apparent to those skilled in the art that various modifications and adaptations may be made without departing from the spirit of the invention or from the scope of the appended claims. For example, those skilled in the art will appreciate that the specific functions depicted herein through the use of block diagrams and flow charts may be partitioned in equivalent but different ways than shown and discussed herein. Such equivalent but different ways and the modifications and adaptations which may be implemented to achieve them are to be included within the scope of the present invention.

What is claimed is:

1. The linearized transmitter having an amplifier which applies a nonlinear amplifier transform having a memoryless component and one or more memory components to a signal input to said amplifier, said linearized transmitter comprising:
   a first processing section adapted to receive a first communication signal and convert said first communication signal into a second communication signal using an inversing transform which approximates an inverse of said memoryless component of said nonlinear amplifier transform;
   a second processing section adapted to receive said second communication signal and convert said second communication signal into a third communication signal using a non-inversing transform which approximates one of said memory components of said nonlinear amplifier transform; and
   a third processing section adapted to combine said first and third communication signals to form a combined communication signal and convert said combined communication signal into a fourth communication signal using said inversing transform, said fourth communication signal corresponding to said signal input to said amplifier.

2. The linearized transmitter as claimed in claim 1 wherein said non-inversing transform and said inversing transform are configured so that said third communication signal is attenuated relative to said first communication signal.

3. The linearized transmitter as claimed in claim 2 wherein said third communication signal is attenuated at least 16 dB relative to said first communication signal.

4. The linearized transmitter as claimed in claim 1 wherein said third processing section combines said third communication signal with a delayed version of said first communication signal.

5. The linearized transmitter as claimed in claim 1 wherein said inversing transform is a gain-normalized inversing transform.

6. The linearized transmitter as claimed in claim 1 additionally comprising a control section coupled between an output of said amplifier and at least one of said first and third processing sections, said control section being configured to implement a continuous processing control loop which processes a signal output from said amplifier as said signal becomes available.

7. The linearized transmitter as claimed in claim 6 wherein:
   said first processing section comprises a look-up table (LUT) having an address input responsive to said first communication signal, said LUT being configured to accept incoming data entries and to provide outgoing data entries;
   said first processing section further comprises a multiplier having a first input responsive to said first communication signal, a second input responsive to said outgoing data entries from said LUT, and an output which provides said second communication signal; and
   said transmitter additionally comprises an adaptive control section having a first input responsive to a signal output from said amplifier, a second input responsive to said first communication signal and an output which provides said incoming data entries to said LUT, said adaptive control section being configured to calculate said incoming data entries without performing complex conversions between Cartesian and polar coordinate systems and without performing division operations.

8. The linearized transmitter as claimed in claim 7 wherein:
   said third processing section updates said inversing transform in response to an error signal; and
   said error signal is responsive to said third communication signal, said first communication signal, and a signal output from said amplifier.

9. The linearized transmitter as claimed in claim 7 wherein:
   said third processing section operates in a normal mode and an inversing transform update mode;
   said third processing section is configured so that during said normal mode said third processing section forms said fourth communication signal by applying said inversing transform to said combined communication signal; and
   said third processing section is configured so that during said inversing transform update mode said third processing section forms said fourth communication signal by applying said inversing transform to said first communication signal.

10. The linearized transmitter as claimed in claim 9 wherein:
    said third processing section is configured to avoid updating said inversing transform during said normal mode and to update said inversing transform during said inversing transform update mode; and
    said third processing section is configured to apply a duty cycle of less than 10% to said inversing transform update mode.

11. The linearized transmitter as claimed in claim 1 wherein:
    said first and second processing sections together form a first residual cancellation section;
    said transmitter additionally comprises a second residual cancellation section having an input coupled to an output of said first residual cancellation section and an output coupled to said third processing section, said second residual cancellation section being configured to convert said third communication signal into a fifth communication signal; and
    said third processing section combines said fifth communication signal into said combined signal.

12. The linearized transmitter as claimed in claim 11 wherein:
    said second residual cancellation section is configured so that said fifth communication signal approximates the product of said third communication signal and a derivative of said third communication signal; and
    said third processing section combines said fifth communication signal and said third communication signal at opposing polarities.

13. The linearized transmitter as claimed in claim 1 wherein said third processing section subtracts said third communication signal from said first communication signal to form said combined communication signal.

14. The linearized transmitter as claimed in claim 1 wherein:
    said nonlinear amplifier transform has at least two memory components;
    said non-inversing transform is a first non-inversing transform which characterizes a first one of said at least two memory components; and
    said linearized transmitter additionally comprises a fourth processing section adapted to receive said second communication signal and convert said second communication signal into a fifth communication signal using a second non-inversing transform which characterizes a second one of said at least two memory components.

15. The linearized transmitter as claimed in claim 14 wherein said parameters which characterize said first and second non-inversing transforms are determined simultaneously.

16. The linearized transmitter as claimed in claim 1 wherein said second processing section comprises:
    a magnitude-extracting section adapted to receive said second communication signal and convert said second communication signal into a magnitude based signal;
    a filtering section adapted to receive said magnitude based signal and convert said magnitude based signal into a filtered magnitude based signal; and
    a multiplying section adapted to convert said second communication signal and said filtered magnitude based signal into a magnitude-shaped communication signal.

17. The linearized transmitter as claimed in claim 16 wherein said second processing section further comprises:
    a scaling section coupled to said multiplying section; and
    an adaptive control section coupled to said scaling section and configured to adaptively generate a complex constant which controls said scaling section, said adaptive control section being further configured to processes a signal output from said amplifier and alter said complex constant to more closely approximate said one of said memory components of said nonlinear amplifier transform.

18. The linearized transmitter as claimed in claim 16 wherein said magnitude-extracting section is configured to determine the magnitude of said second communication signal raised to an integral power.

19. The linearized transmitter as claimed in claim 16 wherein said filtering section is configured to implement an infinite impulse response (IIR) filter.

20. The method of linearizing a transmitter having an amplifier which applies a nonlinear amplifier transform having a memoryless component and one or more memory components to a signal input to said amplifier, said method comprising:
    converting a first communication signal into a second communication signal using an inversing transform which approximates an inverse of said memoryless component of said nonlinear amplifier transform;
    changing said second communication signal into a third communication signal using a non-inversing transform which approximates one of said memory components of said nonlinear amplifier transform;
    combining said first and third communication signals to form a combined communication signal; and
    forming a fourth communication signal from said combined communication signal using said inversing transform, said fourth communication signal corresponding to said signal input to said amplifier.

21. The method as claimed in claim 20 additionally comprising:
    adaptively determining said inversing transform in response to a signal output from said amplifier and said first communication signal using a first control loop having a first loop bandwidth; and
    adaptively determining said non-inversing transform in response to said signal output from said amplifier and said first communication signal using a second control loop having a second loop bandwidth, said second loop bandwidth being greater than said first loop bandwidth.

22. The method as claimed in claim 20 additionally comprising configuring said non-inversing transform and said inversing transform so that said third communication signal is attenuated relative to said first communication signal.

23. The method as claimed in claim 22 wherein said third communication signal is attenuated at least 16 dB relative to said first communication signal.

24. The method as claimed in claim 20 wherein said inversing transform is a gain-normalized inversing transform.

25. The method as claimed in claim 20 additionally comprising calculating, without converting between Cartesian and polar coordinate systems and without performing division operations, a gain-based look-up table which implements said inversing transform.

26. The method as claimed in claim 20 wherein said first and third communication signals are combined through a subtraction operation to form said combined communication signal.

27. The method as claimed in claim 20 additionally comprising updating said inversing transform in response to an error signal, said error signal being responsive to said third communication signal, said first communication signal, and a signal output from said amplifier.

28. The method as claimed in claim 20 additionally comprising:
    operating said transmitter in a normal mode and an inversing transform update mode;
    forming said fourth communication signal by applying said inversing transform to said combined communication signal during said normal mode; and
    forming said fourth communication signal by applying said inversing transform to said first communication signal during said inversing transform update mode.

29. The linearized transmitter as claimed in claim 28 wherein:
    said transmitter avoids updating said inversing transform during said normal mode and updates said inversing transform during said inversing transform update mode; and
    transmitter applies a duty cycle of less than 10% to said inversing transform update mode.

30. A linearized transmitter having an amplifier which applies a nonlinear amplifier transform having a memoryless component and one or more memory components to a signal input to said amplifier, said linearized transmitter comprising:
    a first processing section adapted to receive a first communication signal and convert said first communication signal into a second communication signal using an inversing transform which approximates an inverse of said memoryless component of said nonlinear amplifier transform, said inversing transform being implemented using a look-up table;
    a second processing section adapted to receive said second communication signal and convert said second communication signal into a third communication signal using a non-inversing transform which approximates one of said memory components of said nonlinear amplifier transform, said non-inversing transform being implemented using a magnitude-extracting section adapted to receive said second communication signal and convert said second communication signal into a magnitude based signal, a filtering section adapted to receive said magnitude based signal and convert said magnitude based signal into a filtered magnitude based signal, and a multiplying section adapted to convert said second communication signal and said filtered magnitude based signal into said third communication signal, said non-inversing transform and said inversing transform being mutually configured so that said third communication signal is attenuated relative to said first communication signal; and
    a third processing section adapted to combine said first and third communication signals to form a combined communication signal and convert said combined communication signal into a fourth communication signal using said inversing transform, said fourth communication signal corresponding to said signal input to said amplifier.

* * * * *